United States Patent
Ozawa

(10) Patent No.: US 9,087,831 B2
(45) Date of Patent: Jul. 21, 2015

(54) SEMICONDUCTOR MODULE INCLUDING FIRST AND SECOND WIRING PORTIONS SEPARATED FROM EACH OTHER

(75) Inventor: Isao Ozawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/558,523

(22) Filed: Jul. 26, 2012

(65) Prior Publication Data

US 2013/0187272 A1 Jul. 25, 2013

(30) Foreign Application Priority Data

Jul. 29, 2011 (JP) ................................. 2011-167697

(51) Int. Cl.

| | |
|---|---|
| H01L 23/04 | (2006.01) |
| H01L 23/48 | (2006.01) |
| H01L 23/52 | (2006.01) |
| H01L 29/40 | (2006.01) |
| H01L 23/498 | (2006.01) |
| H01L 23/00 | (2006.01) |
| H01L 25/065 | (2006.01) |
| H01L 23/31 | (2006.01) |
| H01L 21/56 | (2006.01) |

(52) U.S. Cl.
CPC .......... *H01L 23/49816* (2013.01); *H01L 24/97* (2013.01); *H01L 25/0655* (2013.01); *H01L 25/0657* (2013.01); *H01L 21/561* (2013.01); *H01L 23/3128* (2013.01); *H01L 2224/32145* (2013.01); *H01L 2224/32225* (2013.01); *H01L 2224/48091* (2013.01); *H01L 2224/48145* (2013.01); *H01L 2224/48227* (2013.01); *H01L 2224/73265* (2013.01); *H01L 2224/97* (2013.01); *H01L 2225/06562* (2013.01); *H01L 2924/12041* (2013.01); *H01L 2924/15311* (2013.01); *H01L 2924/15321* (2013.01)

(58) Field of Classification Search
None
See application file for complete search history.

(56) References Cited

U.S. PATENT DOCUMENTS

| 8,124,461 B2 | 2/2012 | Chen et al. |
| 8,350,380 B2 | 1/2013 | Chen et al. |
| 2002/0000462 A1* | 1/2002 | Mead et al. ................ 228/248.1 |
| 2002/0140084 A1* | 10/2002 | Kimura ........................ 257/723 |
| 2003/0085465 A1* | 5/2003 | Kajimoto et al. ............. 257/734 |

(Continued)

FOREIGN PATENT DOCUMENTS

| CN | 101471317 A | 7/2009 |
| JP | 2001-68588 | 3/2001 |

(Continued)

OTHER PUBLICATIONS

Chinese Office Action issued Aug. 5, 2014, in China Patent Application No. 201210265418.6 (with English translation).

(Continued)

*Primary Examiner* — Mamadou Diallo
*Assistant Examiner* — Jay C Chang
(74) *Attorney, Agent, or Firm* — Oblon, McClelland, Maier & Neustadt, L.L.P.

(57) ABSTRACT

According to one embodiment, a semiconductor module includes a semiconductor chip that is mounted on a printed substrate, a terminal electrode that is formed on the printed substrate so as to be electrically connected to the semiconductor chip, a metal coating layer that is formed on the terminal electrode, a plating lead wire that is electrically connected to the terminal electrode, and a gap that is formed in the plating lead wire.

20 Claims, 20 Drawing Sheets

(56) References Cited

U.S. PATENT DOCUMENTS

| | | | |
|---|---|---|---|
| 2003/0209793 A1* | 11/2003 | Nishizawa et al. | 257/679 |
| 2004/0036158 A1* | 2/2004 | Tanaka et al. | 257/698 |
| 2004/0140552 A1* | 7/2004 | Kuroda et al. | 257/700 |
| 2005/0029666 A1 | 2/2005 | Kurihara et al. | |
| 2005/0243530 A1* | 11/2005 | Ha | 361/777 |
| 2006/0049510 A1* | 3/2006 | Otsuki | 257/700 |
| 2006/0231198 A1* | 10/2006 | Vasoya | 156/256 |
| 2006/0249787 A1* | 11/2006 | Voldman | 257/339 |
| 2006/0259829 A1* | 11/2006 | Keays | 714/42 |
| 2007/0045873 A1 | 3/2007 | Takemoto | |
| 2007/0147164 A1* | 6/2007 | Lee et al. | 365/230.06 |
| 2007/0170573 A1* | 7/2007 | Kuroda et al. | 257/686 |
| 2008/0211068 A1 | 9/2008 | Chen et al. | |
| 2008/0291654 A1* | 11/2008 | Liao et al. | 361/818 |
| 2009/0321896 A1* | 12/2009 | Yamano | 257/659 |
| 2010/0090333 A1* | 4/2010 | Hayashi | 257/693 |
| 2011/0039375 A1* | 2/2011 | Nakagawa et al. | 438/121 |
| 2011/0088925 A1* | 4/2011 | Tatsumi et al. | 174/69 |
| 2012/0104588 A1 | 5/2012 | Chen et al. | |

FOREIGN PATENT DOCUMENTS

| | | |
|---|---|---|
| JP | 2007-42957 | 2/2007 |
| JP | 2007-59693 | 3/2007 |
| JP | 2009-147270 | 7/2009 |
| TW | 579587 | 3/2004 |

OTHER PUBLICATIONS

Japanese Office Action issued Jul. 22, 2014, in Japan Patent Application No. 2011-167697 (with English translation).

Taiwanese Office Action issued Jul. 8, 2014, in Taiwan Patent Application No. 101124991 (with English translation).

* cited by examiner

SEMICONDUCTOR MODULE INCLUDING FIRST AND SECOND WIRING PORTIONS SEPARATED FROM EACH OTHER

CROSS-REFERENCE TO RELATED APPLICATIONS

This application is based upon and claims the benefit of priority from Japanese Patent Application No. 2011-167697, filed on Jul. 29, 2011; the entire contents of which are incorporated herein by reference.

FIELD

Embodiments described herein relate generally to a semiconductor module.

BACKGROUND

In semiconductor modules such as ball grid arrays, since land electrodes bonded to solder balls are subjected to electroplating, plating lead wires are led out from the land electrodes. The plating lead wires function as stub wirings in relation to signal wires, if the plating lead wires are present, stub noise is superimposed on signals, and the quality of signals may have deteriorated.

DETAILED DESCRIPTION

In general, according to one embodiment, a semiconductor module includes a semiconductor chip, a terminal electrode, a metal coating layer, a lead wire, and a gap. The semiconductor chip is mounted on a printed substrate. The terminal electrode is formed on the printed substrate so as to be electrically connected to the semiconductor chip. The metal coating layer is formed on the terminal electrode. The lead wire is electrically connected to the terminal electrode. The gap divides the lead wire in a wiring direction.

Exemplary embodiments of a semiconductor module will be explained below in detail with reference to the accompanying drawings. The present invention is not limited to the following embodiments.

First Embodiment

Figure 1A:
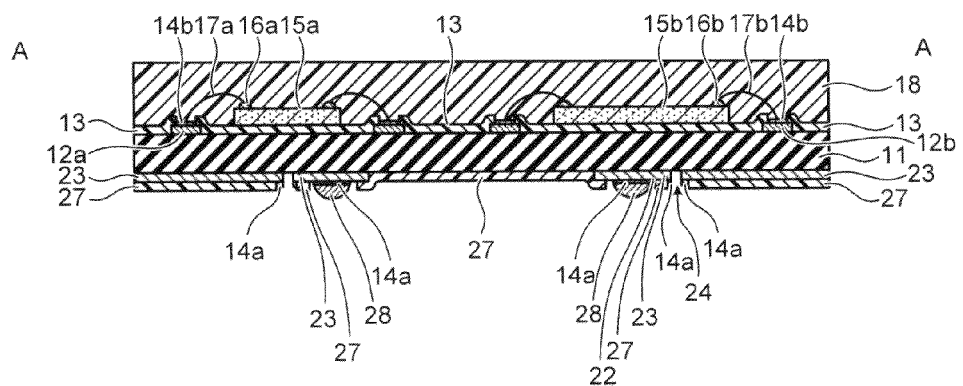
FIG. 1A is a cross-sectional view illustrating a schematic configuration of a semiconductor module according to a first embodiment and FIG. 1B is a plan view illustrating a schematic configuration of the semiconductor module according to the first embodiment.
Figure 1B:
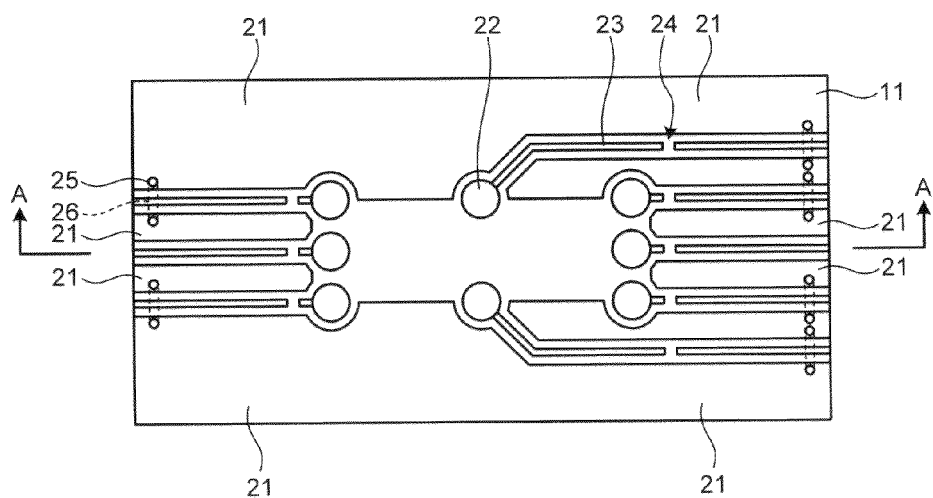

FIG. 1A is a cross-sectional view illustrating a schematic configuration of a semiconductor module according to a first embodiment and FIG. 1B is a plan view illustrating a schematic configuration of the semiconductor module according to the first embodiment. FIG. 1A is a cross-sectional view taken along line A-A of FIG. 1B.

In FIGS. 1A and 1B, terminal electrodes 12a and 12b are formed on a front surface of a printed substrate 11. As the printed substrate 11, a multi-layered substrate may be used, and a build-up substrate may be used. Moreover, as a base material of the printed substrate 11, a glass epoxy resin may be used, for example, and a sheet substrate of polyimide or polyester may be used. A solder resist layer 13 may be formed on the front surface of the printed substrate 11 so that the front surfaces of the terminal electrodes 12a and 12b are exposed.

Here, a metal coating layer 14b is formed on the front surfaces of the terminal electrodes 12a and 12b exposed from the solder resist layer 13.

Moreover, semiconductor chips 15a and 15b are mounted on the front-surface side of the printed substrate 11. The semiconductor chips 15a and 15b may be mounted on the front-surface side of the printed substrate 11 using a bare-chip mounting technique. A nonvolatile semiconductor storage device (hereinafter referred to as a "NAND memory") such as, for example, a NAND-type flash memory or a resistance-variable memory may be formed on the semiconductor chip 15b. A controller for controlling the driving of the NAND memory, for example, may be formed on the semiconductor chip 15a. Examples of the driving control of the NAND memory include control of reading and writing, block selection, error correction, and wear leveling of the NAND memory.

Here, pad electrodes 16a and 16b are formed on the semiconductor chips 15a and 15b, respectively. The pad electrodes 16a and 16b are electrically connected to the terminal electrodes 12a and 12b via bonding wires 17a and 17b, respectively. Moreover, a sealing resin 18 is formed on the front-surface side of the printed substrate 11, and the semiconductor chips 15a and 15b and the bonding wires 17a and 17b are sealed by the sealing resin 18. As the sealing resin 18, an epoxy resin, a silicon resin, or the like may be used, for example.

On the other hand, a terminal electrode 22 and a plating lead wire 23 are formed on a rear surface of the printed substrate 11. Here, the plating lead wire 23 is connected to the terminal electrode 22, and is extended to an end portion of the printed substrate 11. A gap 24 is formed in the plating lead wire 23, whereby the plating lead wire 23 is divided in a wiring direction. In the gap 24, it is possible to dispose the plating lead wire 23 so that the end portions of the divided parts thereof face each other. In order to decrease the amount of the plating lead wire 23 superimposed on the terminal electrode 22 as a stub wire, it is preferable to dispose the gap 24 of the plating lead wire 23 in the vicinity of the terminal electrode 22. Moreover, a constant-voltage pattern 21 is formed on the rear surface of the printed substrate 11 outside the terminal electrode 22 and the plating lead wire 23. The constant-voltage pattern 21 may be a ground pattern and may be a voltage source pattern. A solder resist layer 27 is formed on the rear surface of the printed substrate 11 so that the front surfaces of the terminal electrode 22 and the gap 24 of the plating lead wire 23 are exposed. A range of areas of the plating lead wire 23 exposed from the solder resist layer 27 may be set to be larger than that of the gap 24. A metal coating layer 14a is formed on part of the front surfaces of the terminal electrode 22 and the plating lead wire 23 exposed from the solder resist layer 27.

Moreover, the constant-voltage pattern 21 is segmented by the plating lead wire 23. The constant-voltage patterns 21 segmented by the plating lead wire 23 are electrically connected to each other by different-layer wires 26 connected to a through-hole 25. Moreover, a solder ball 28 is formed on the terminal electrode 22.

The terminal electrodes 12a, 12b, and 22 may be electrically connected via an internal wire of the printed substrate 11. Moreover, the terminal electrodes 12a, 12b, and 22, the constant-voltage pattern 21, and the plating lead wire 23 may be formed of a Cu pattern, for example. A stacked structure of Au and Ni, for example, may be used as the metal coating layers 14a and 14b. Moreover, a plated layer may be used as the metal coating layers 14a and 14b.

Here, since the gap 24 is formed in the plating lead wire 23 with the plating lead wire 23 remaining on the printed substrate 11, it is possible to decrease the stub wire superimposed on the terminal electrode 22 without increasing the range of areas of the plating lead wire 23 exposed from the solder resist layer 27 more than necessary. Thus, it is possible to reduce stub noise superimposed on signals while suppressing a decrease in reliability of the printed substrate 11 and to suppress a decrease in the quality of signals.

Second Embodiment

Figure 2A:
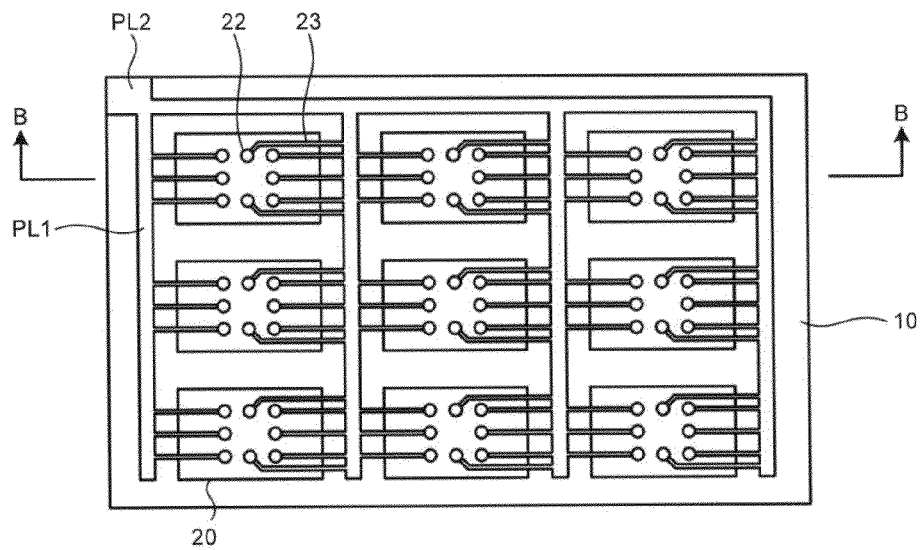
FIG. 2A is a plan view illustrating a method of manufacturing a printed substrate according to a second embodiment and FIGS. 2B to 2D are cross-sectional views illustrating a method of manufacturing the printed substrate according to the second embodiment.
Figure 2B:
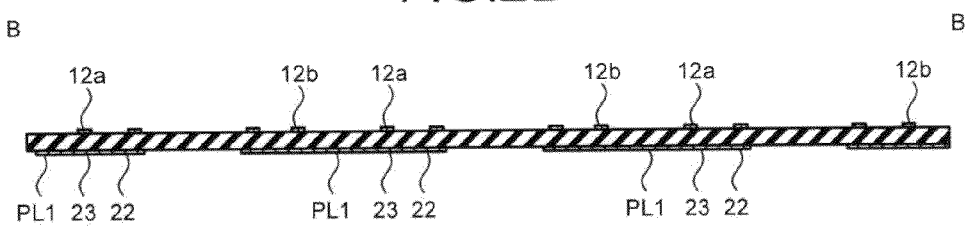
Figure 2C:
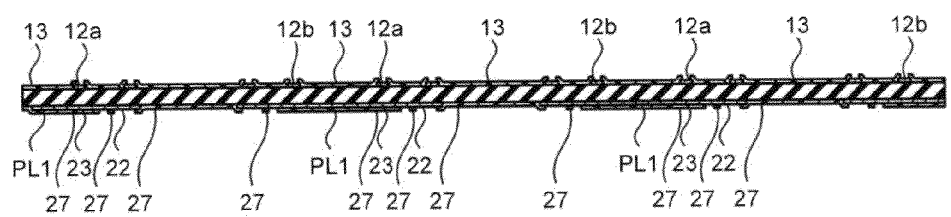
Figure 2D:
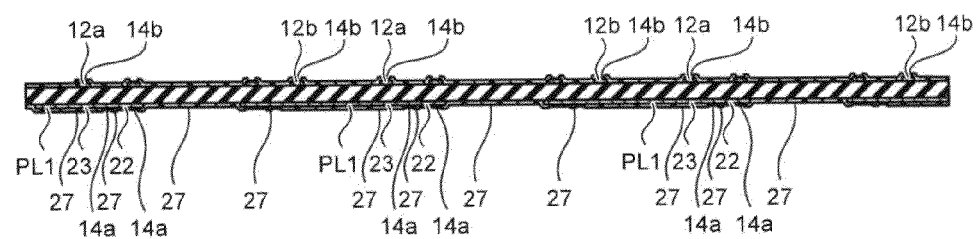

FIG. 2A is a plan view illustrating a method of manufacturing a printed substrate according to a second embodiment and FIGS. 2B to 2D are cross-sectional views illustrating a method of manufacturing the printed substrate according to the second embodiment. FIG. 2B is a cross-sectional view taken along line B-B of FIG. 2A.

In FIGS. 2A and 2B, a base material 10 is partitioned into respective fragmented regions 20. A terminal electrode 22 and a plating lead wire 23 are formed in each of the fragmented regions 20 on the rear surface of the base material 10, and a power-feeding wire PL1 and a power-feeding terminal PL2 connected to the plating lead wire 23 are formed on the rear surface of the base material 10 outside the respective fragmented regions 20. Moreover, terminal electrodes 12a and 12b are formed in each of the fragmented regions 20 on the front surface of the base material 10. The plating lead wire and the power-feeding wire connected to the terminal electrodes 12a and 12b, respectively, may be also formed on the front surface of the base material 10.

Subsequently, as illustrated in FIG. 2C, a solder resist layer 13 is formed on the front surface of the base material 10, and the front surfaces of the terminal electrodes 12a and 12b are exposed by patterning the solder resist layer 13 using a photo-etching method or the like. Moreover, a solder resist layer 27 is formed on the rear surface of the base material 10, and the front surfaces of part of the terminal electrode 22 and the plating lead wire 23 are exposed by patterning the solder resist layer 27 using a photo-etching method or the like.

Subsequently, as illustrated in FIG. 2D, a metal coating layer 14a is formed on the front surface of the terminal electrode 22 exposed from the solder resist layer 27 by supplying electric current to the terminal electrode 22 via the power-feeding wire PL1 and the plating lead wire 23 in an electroplating bath. Moreover, a metal coating layer 14b is formed on the front surfaces of the terminal electrodes 12a and 12b exposed from the solder resist layer 13 by supplying electric current to the terminal electrodes 12a and 12b via the plating lead wires connected to the terminal electrodes 12a and 12b.

Third Embodiment

Figure 3A:
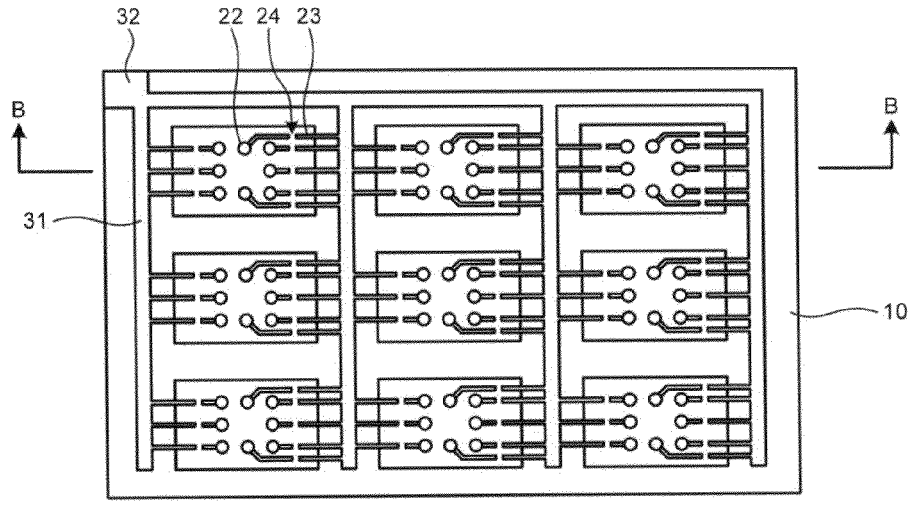
FIG. 3A is a plan view illustrating a method of manufacturing a semiconductor module according to a third embodiment and FIGS. 3B to 3F are cross-sectional views illustrating a method of manufacturing the semiconductor module according to the third embodiment.
Figure 3B:
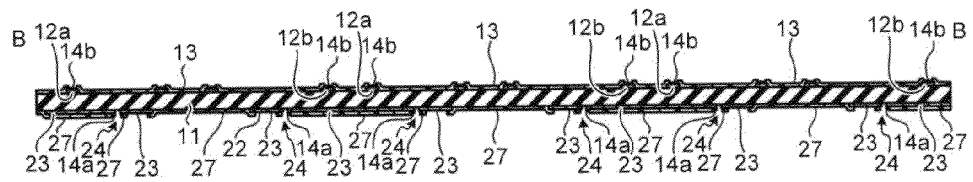

FIG. 3A is a plan view illustrating a method of manufacturing a semiconductor module according to a third embodiment and FIGS. 3B to 3F are cross-sectional views illustrating a method of manufacturing the semiconductor module according to the third embodiment. FIG. 3B is a cross-sectional view taken along line B-B of FIG. 3A.

In FIGS. 3A and 3B, after the step of FIG. 2D is performed, the plating lead wire 23 is divided halfway by forming a gap 24 in the plating lead wire 23 exposed from the solder resist layer 27.

Figure 3C:
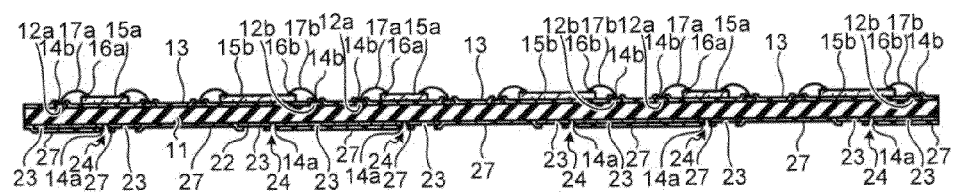

Subsequently, as illustrated in FIG. 3C, the semiconductor chips 15a and 15b are mounted on the front-surface side of the base material 10. The pad electrodes 16a and 16b and the terminal electrodes 12a and 12b are electrically connected via the bonding wires 17a and 17b, respectively.

Figure 3D:
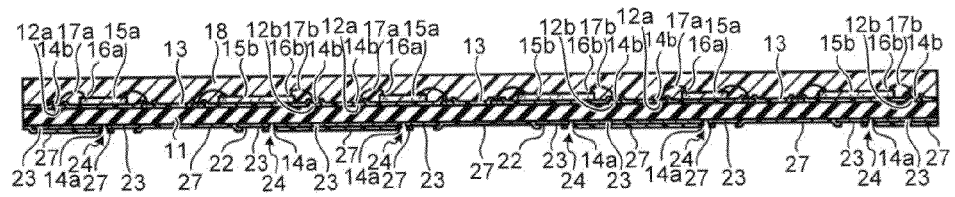

Subsequently, as illustrated in FIG. 3D, the sealing resin 18 is formed on the front-surface side of the base material 10 using an injection molding method or the like, and the semiconductor chips 15a and 15b and the bonding wires 17a and 17b are sealed by the sealing resin 18.

Figure 3E:
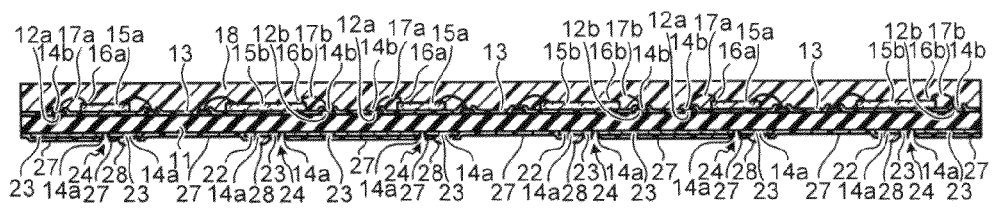

Subsequently, as illustrated in FIG. 3E, the solder ball 28 is formed on the terminal electrode 22 on the rear-surface side of the base material 10.

Figure 3F:
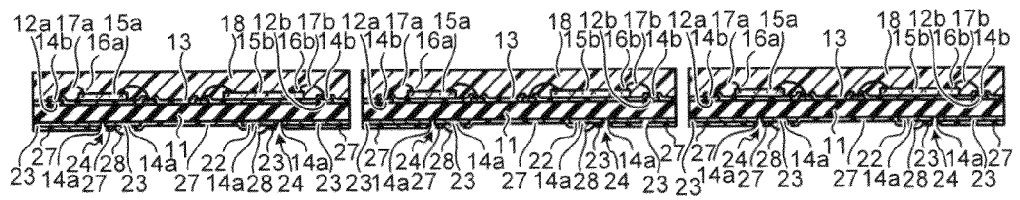

Subsequently, as illustrated in FIG. 3F, the base material 10 is segmented into respective fragmented regions 20 using a dicing method or the like.

Fourth Embodiment

Figure 4:
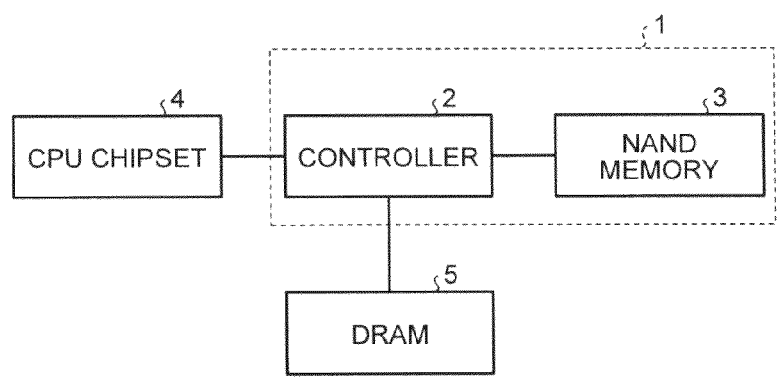
FIG. 4 is a block diagram illustrating a schematic configuration of a semiconductor storage device according to a fourth embodiment.

FIG. 4 is a block diagram illustrating a schematic configuration of a semiconductor storage device according to a fourth embodiment.

In FIG. 4, a controller 2 and a NAND memory 3 are mounted on a semiconductor module 1. The semiconductor module 1 may have the configuration illustrated in FIG. 1A, for example. Moreover, the controller 2 is connected to the NAND memory 3, a CPU chipset 4, and a DRAM 5.

Here, the data communication between the controller 2 and the CPU chipset 4 may be compliant to the SATA standards, for example. For example, the SATA1 standards provide a data transfer rate of 150 MB/sec, or 1000 Mbit/sec per bit, which is 8 times greater than the former number. On the other hand, the data communication between the controller 2 and the DRAM 5 may be compliant to the DDR200 standards. For example, the DDR200 standards provide an operating frequency of 200 MHz and an actual frequency of 100 MHz.

Here, when the configuration of FIG. 1A is used as the semiconductor module 1, the controller 2 is electrically connected to the CPU chipset 4 and the DRAM 5 via the solder balls 28 of FIG. 1A.

Thus, by forming the gap 24 in the plating lead wire 23, it is possible to decrease the stub wire superimposed on the terminal electrode 22 and reduce stub noise superimposed on signals exchanged between the controller 2 and the CPU chipset 4 or the DRAM 5.

The transfer rate of the data communication between the controller 2 and the NAND memory 3 is slower than that of the data communication between the controller 2 and the CPU chipset 4 or the DRAM 5. Here, when the configuration of FIG. 1A is used as the semiconductor module 1, the controller 2 is electrically connected to the NAND memory 3 via the terminal electrodes 12a and 12b. Thus, it is not always necessary to form a gap in the plating lead wires connected to the terminal electrodes 12a and 12b.

Fifth Embodiment

Figure 5A:
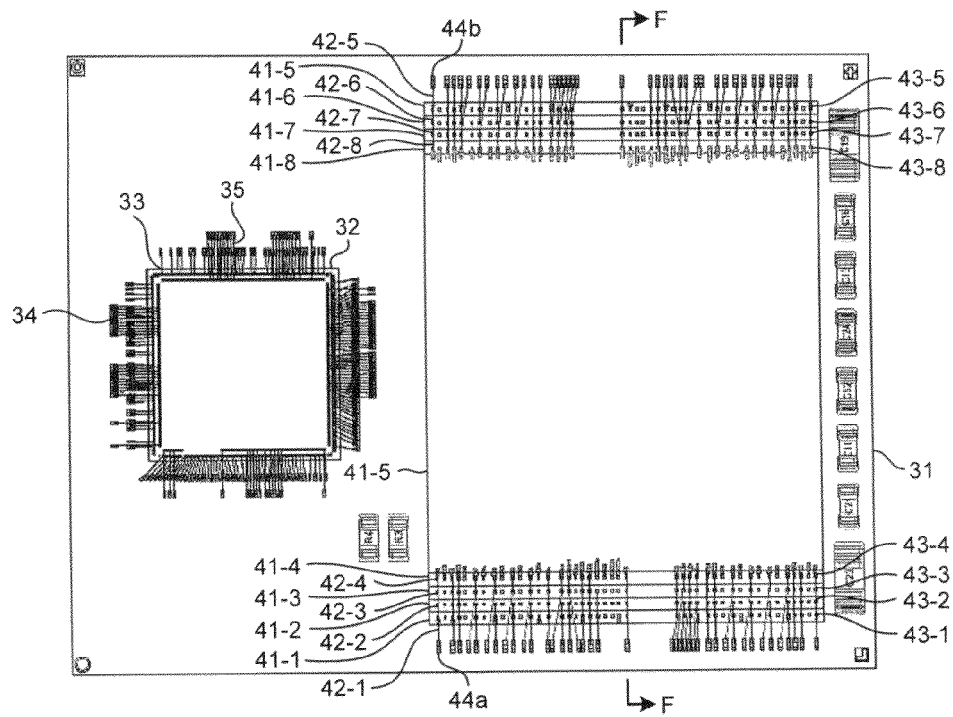
FIGS. 5A and 5B are plan views illustrating a schematic configuration of respective layers of a semiconductor module according to a fifth embodiment.
Figure 5B:
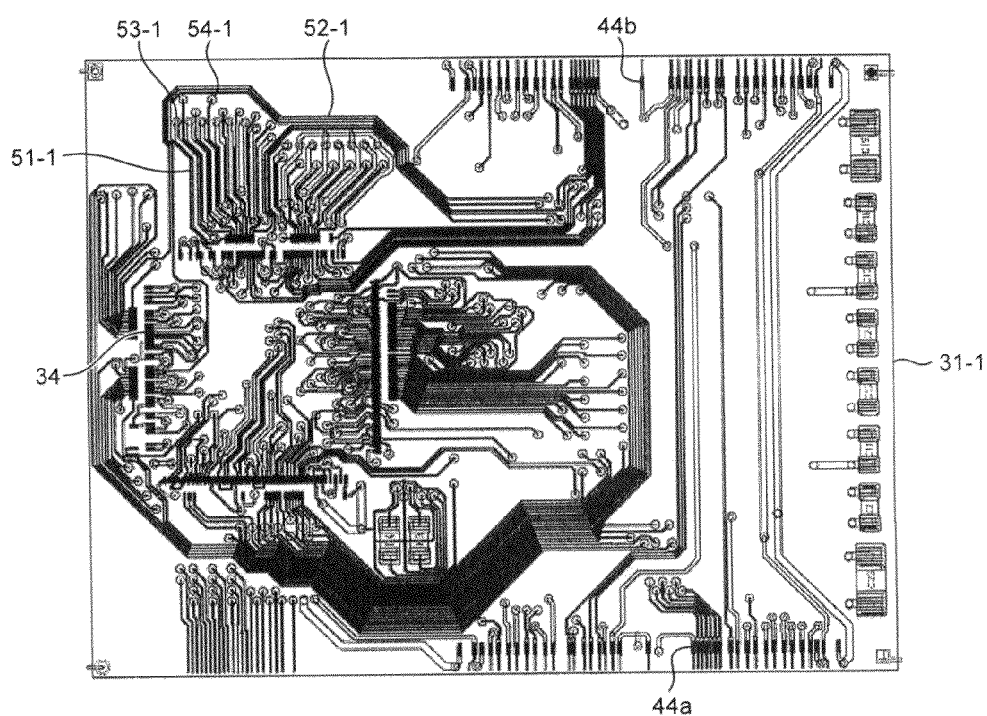
Figure 6A:
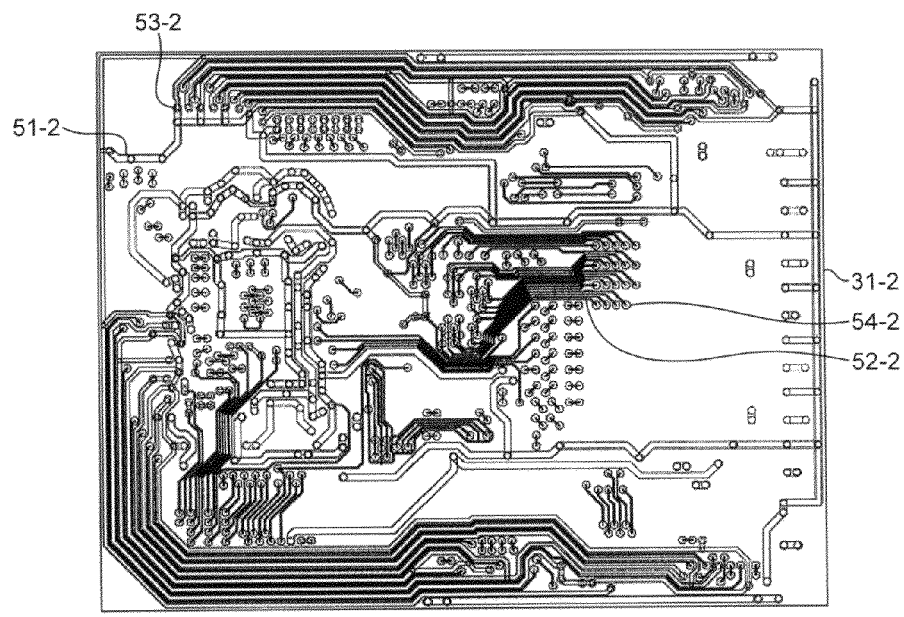
FIGS. 6A and 6B are plan views illustrating a schematic configuration of respective layers of the semiconductor module according to the fifth embodiment.
Figure 6B:
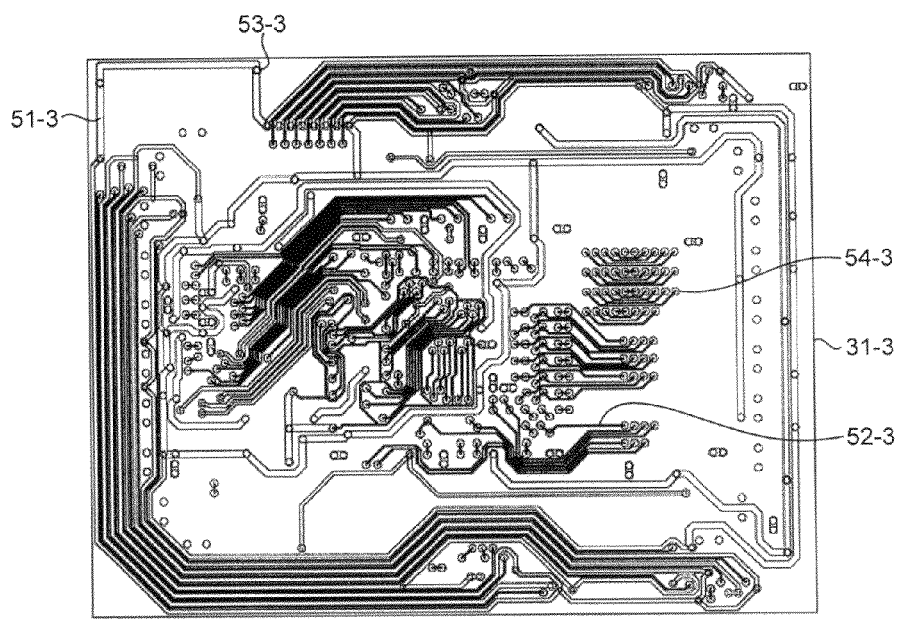
Figure 7A:
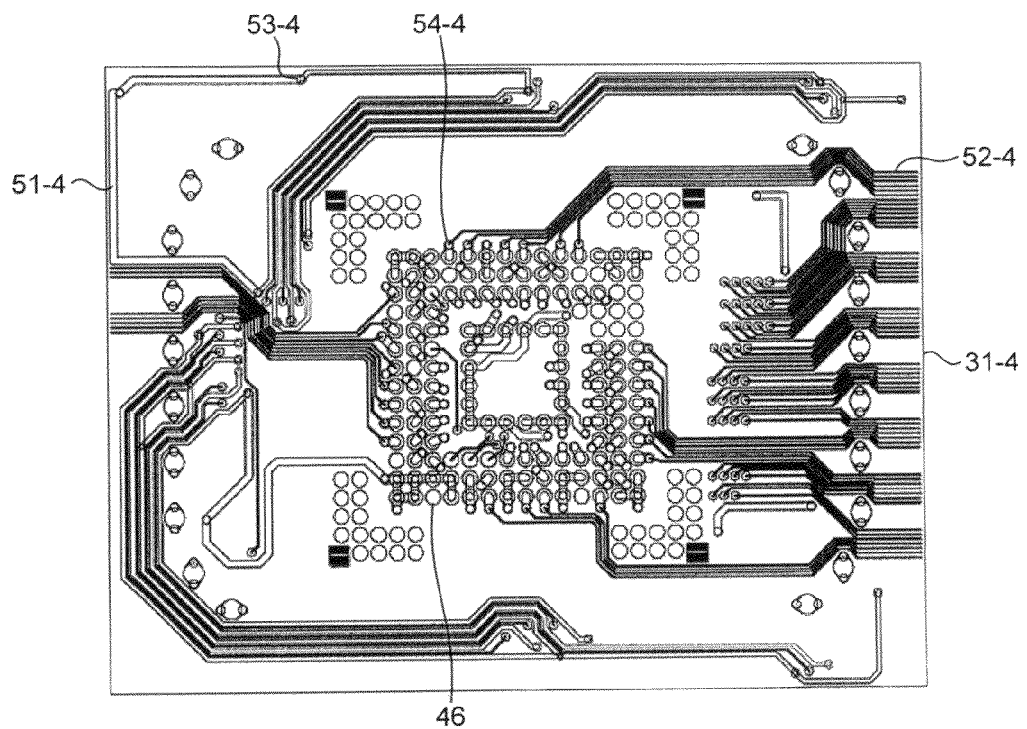
FIGS. 7A and 7B are plan views illustrating a schematic configuration of respective layers of the semiconductor module according to the fifth embodiment.
Figure 7B:
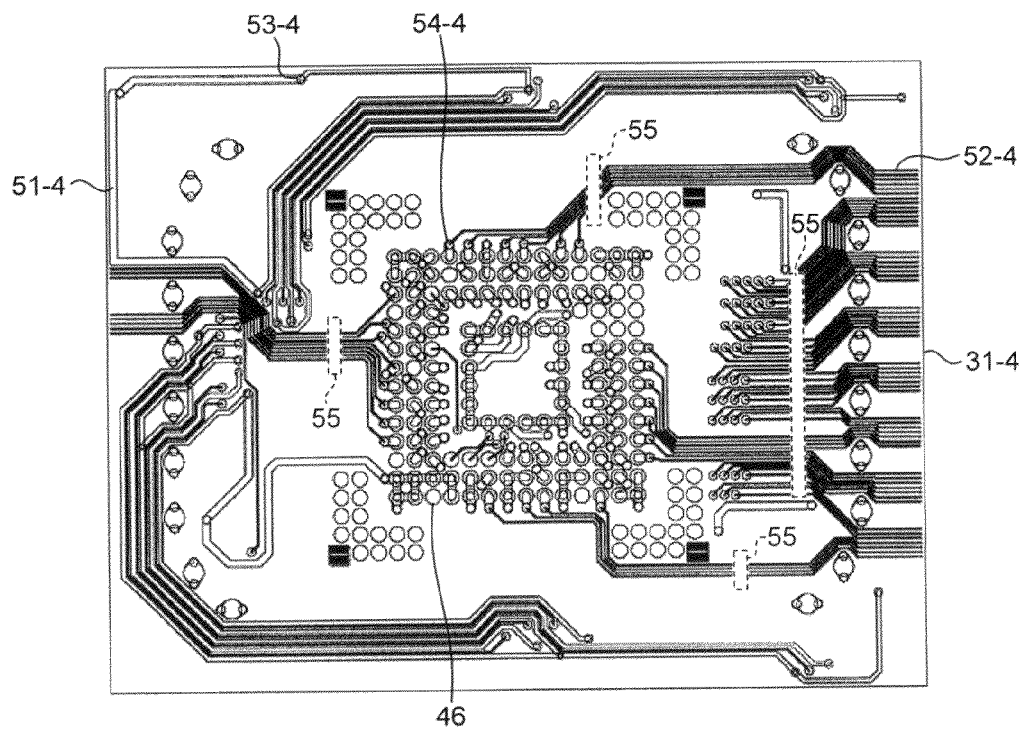
Figure 8A:
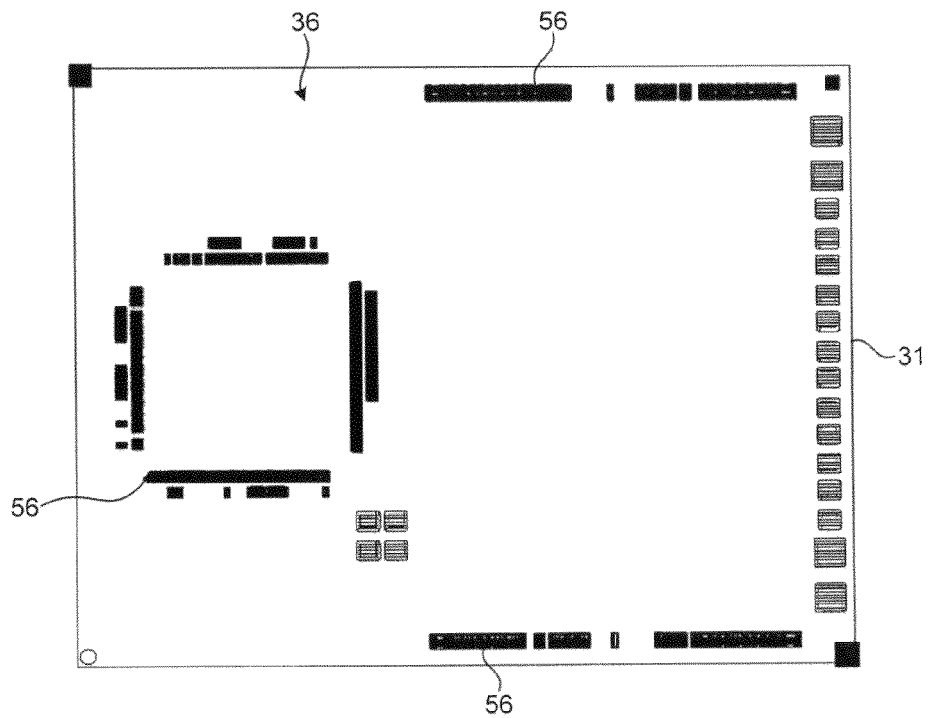
FIGS. 8A and 8B are plan views illustrating a schematic configuration of respective layers of the semiconductor module according to the fifth embodiment.
Figure 8B:
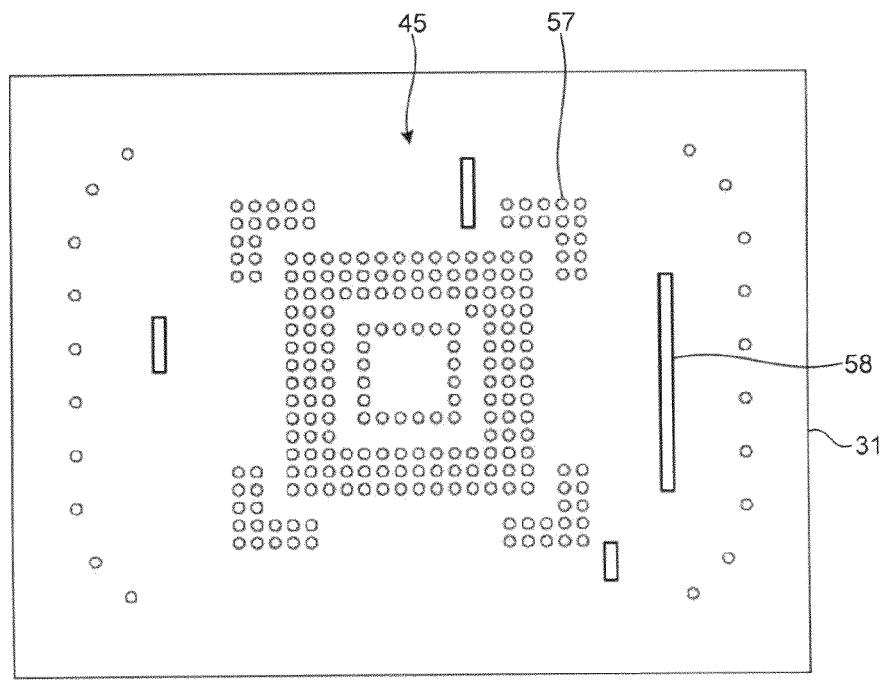
Figure 9:
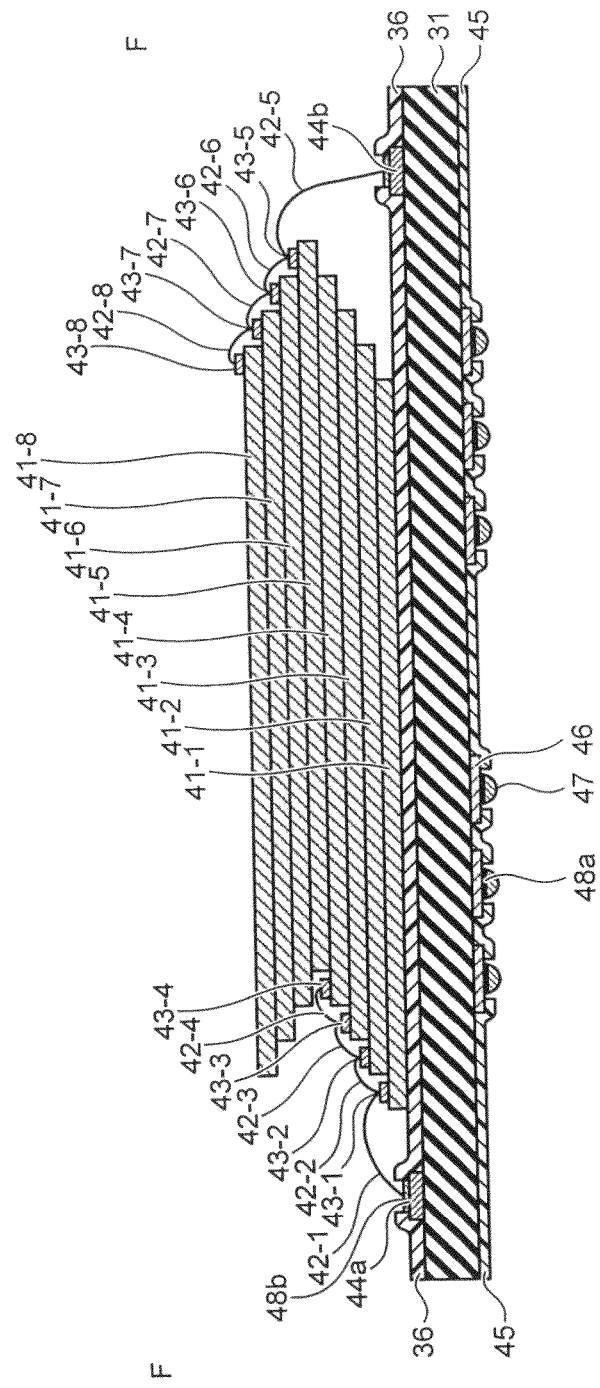
FIG. 9 is a cross-sectional view illustrating schematic configuration taken along line F-F of FIG. 5A.

FIGS. 5A to 8A and FIGS. 5B to 8B are plan views illustrating a schematic configuration of respective layers of a semiconductor module according to a fifth embodiment. FIG. 9 is a cross-sectional view illustrating a schematic configuration taken along line F-F of FIG. 5A. The fifth embodiment illustrates a case where a four-layered substrate is used. FIG. 5A illustrates a mounting state on a printed substrate 31, and FIG. 5B illustrates the configuration of a first wiring layer of the printed substrate 31. FIG. 6A illustrates the configuration of a second wiring layer of the printed substrate 31, and FIG. 6B illustrates the configuration of a third wiring layer of the printed substrate 31. FIG. 7A illustrates the configuration of a fourth wiring layer of the printed substrate 31 before a gap 55 is formed, and FIG. 7B illustrates the configuration of the fourth wiring layer of the printed substrate 31 after the gap 55 is formed. FIG. 8A illustrates the configuration of a solder resist layer 36 of the first wiring layer of the printed substrate 31, and FIG. 8B illustrates the configuration of a solder resist layer 45 of the fourth wiring layer of the printed substrate 31. In addition, the ground pattern and the voltage source pattern are not illustrated in FIGS. 5A to 8A and FIGS. 5B to 8B.

In FIGS. 5A and 9, terminal electrodes 34, 44a, and 44b are formed on the front surface of the printed substrate 31. The solder resist layer 36 is formed on the front surface of the printed substrate 31 so that the front surfaces of the terminal electrodes 34, 44a, and 44b are exposed. Here, a metal coating layer 48b is formed on the front surfaces of the terminal electrodes 34, 44a, and 44b exposed from the solder resist layer 36.

Moreover, semiconductor chips 32 and 41-1 to 41-8 are mounted on the front-surface side of the printed substrate 31. A NAND memory, for example, may be formed on the respective semiconductor chips 41-1 to 41-8. A controller for controlling the driving of the NAND memory, for example, may be formed on the semiconductor chip 32.

Here, pad electrodes 33 are formed on the semiconductor chip 32, and pad electrodes 43-1 to 43-8 are formed on the semiconductor chips 41-1 to 41-8, respectively. The pad electrodes 43-1 to 43-8 may be disposed along one set of the ends of the respective semiconductor chips 41-1 to 41-8. Moreover, the semiconductor chips 41-1 to 41-8 are stacked sequentially on the printed substrate 31 so as to be displaced from each other so that the pad electrodes 43-1 to 43-8 are exposed. In this case, the semiconductor chips 41-1 to 41-5 may be disposed so as to be displaced in a certain direction, and the semiconductor chips 41-6 to 41-8 may be disposed so as to be displaced in the opposite direction.

The pad electrodes 33 are electrically connected to the terminal electrodes 34 via bonding wires 35. The pad electrodes 43-1 to 43-4 are electrically connected to the terminal electrodes 44a via bonding wires 42-1 to 42-4, respectively. The pad electrodes 43-5 to 43-8 are electrically connected to the terminal electrodes 44b via bonding wires 42-5 to 42-8, respectively.

The bonding wires 42-1 to 42-8 may be formed in the following manner. First, the bonding wires 42-1 to 42-4 are formed after the semiconductor chips 41-1 to 41-4 are mounted on the printed substrate 31. After that, the bonding wires 42-5 to 42-8 are formed after the semiconductor chips 41-5 to 41-8 are mounted on the printed substrate 31.

Moreover, in FIG. 5B, the terminal electrodes 34, 44a, and 44b, signal wires 51-1, plating lead wires 52-1, and through-holes 53-1 and 54-1 are formed on the first wiring layer 31-1.

Here, the plating lead wires 52-1 are connected to the terminal electrodes 34, 44a, and 44b. Moreover, the through-holes 53-1 enable the signal wires 51-1 of the subject layer to be connected to the signal wires of the other layers. The through-holes 54-1 enable the plating lead wires 52-1 of the subject layer to be connected to the plating lead wires of the other layers.

Moreover, in FIG. 6A, signal wires 51-2, plating lead wires 52-2, and through-holes 53-2 and 54-2 are formed on the second wiring layer 31-2. Here, the through-holes 53-2 enable the signal wires 51-2 of the subject layer to be connected to the signal wires of the other layers. The through-holes 54-2 enable the plating lead wires 52-2 of the subject layer to be connected to the plating lead wires of the other layers.

Moreover, in FIG. 6B, signal wires 51-3, plating lead wires 52-3, and through-holes 53-3 and 54-3 are formed on the third wiring layer 31-3. Here, the through-holes 53-3 enable the signal wires 51-3 of the subject layer to be connected to the signal wires of the other layers. The through-holes 54-3 enable the plating lead wires 52-3 of the subject layer to be connected to the plating lead wires of the other layers.

Moreover, in FIG. 7A, terminal electrodes 46, signal wires 51-4, plating lead wires 52-4, and through-holes 53-4 and 54-4 are formed on the fourth wiring layer 31-4 before the gap 55 of FIG. 7B is formed.

Here, the plating lead wires 52-4 are connected to the terminal electrodes 46. Moreover, the through-holes 53-4 enable the signal wires 51-4 of the subject layer to be connected to the signal wires of the other layers. The through-holes 54-4 enable the plating lead wires 52-4 of the subject layer to be connected to the plating lead wires of the other layers.

Moreover, as illustrated in FIG. 7B, after the metal coating layer 48a is formed on the terminal electrodes 46, the plating lead wires 52-4 are divided halfway by forming the gap 55 in the plating lead wires 52-4.

Moreover, in FIG. 8A, the solder resist layer 36 is formed on the front surface of the printed substrate 31 so as to cover the terminal electrodes 34, 44a, and 44b, the signal wires 51-1, the plating lead wires 52-1, and the through-holes 53-1 and 54-1. Here, openings 56 are formed in the solder resist layer 36 so that the front surfaces of the terminal electrodes 34, 44a, and 44b are exposed.

Moreover, in FIGS. 8B and 9, the solder resist layer 45 is formed on the rear surface of the printed substrate 31 so as to cover the terminal electrodes 46, the signal wires 51-4, the plating lead wires 52-4, and the through-holes 53-4 and 54-4. Here, openings 57 and 58 are formed in the solder resist layer 45 so that the front surfaces of the terminal electrodes 46 and the gap 55 are exposed. Solder balls 47 are bonded to the terminal electrodes 46 via the metal coating layer 48a.

Here, since the gap 55 is formed in the plating lead wires 52-4, it is not necessary to remove all the plating lead wires 52-4 in order to reduce the stub wires superimposed on the terminal electrodes 46. Thus, it is not necessary to remove all of the portions of the solder resist layer 45 formed on the plating lead wires 52-4. Accordingly, since it is possible to prevent the signal wires 51-4 and the through-holes 53-4 and 54-4 from being exposed from the solder resist layer 45, it is possible to suppress a decrease in the quality of signals.

In the fifth embodiment described above, although a method of stacking eight layers of the semiconductor chips 41-1 to 41-8 on the printed substrate 31 has been described, the number of stacked layers is not limited to 8 but may be any number that is 1 or more.

Sixth Embodiment

Figure 10A:
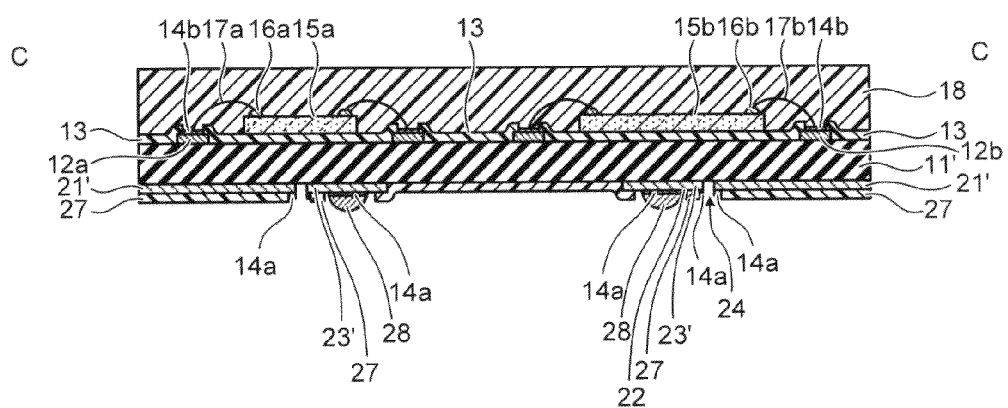
FIG. 10A is a cross-sectional view illustrating a schematic configuration of a semiconductor module according to a sixth embodiment and FIG. 10B is a plan view illustrating a schematic configuration of a semiconductor module according to the sixth embodiment.
Figure 10B:
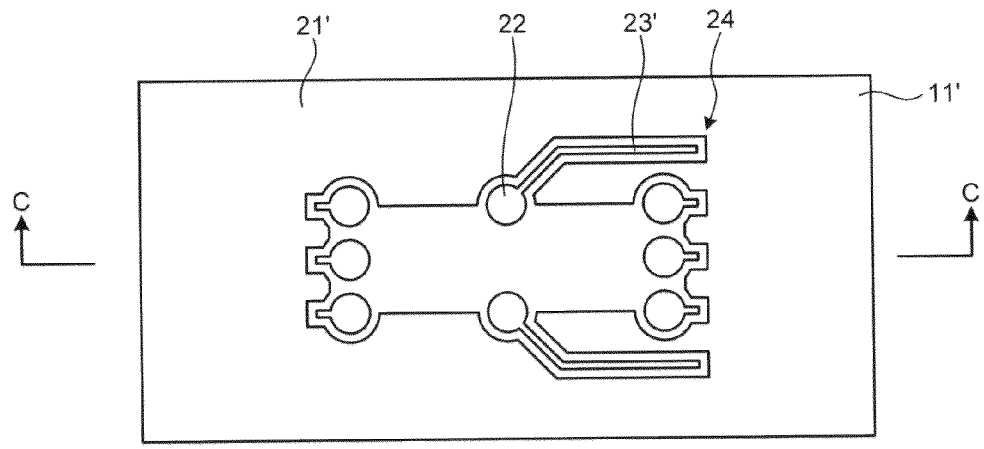

FIG. 10A is a cross-sectional view illustrating a schematic configuration of a semiconductor module according to a sixth embodiment and FIG. 10B is a plan view illustrating a schematic configuration of a semiconductor module according to the sixth embodiment. FIG. 10A is a cross-sectional view taken along line C-C of FIG. 10B.

In the semiconductor module illustrated in FIGS. 10A and 10B, a printed substrate 11' is formed instead of the printed substrate 11 of the semiconductor module illustrated in FIGS. 1A and 1B. A constant-voltage pattern 21' and a plating lead wire 23' are formed on the printed substrate 11' instead of the constant-voltage pattern 21 and the plating lead wire 23 of the printed substrate 11. The constant-voltage pattern 21' may be a ground pattern and may be a voltage source pattern.

Here, a gap 24 is formed in the plating lead wire 23'. Moreover, the plating lead wire 23' is disposed so that the end portion thereof faces the constant-voltage pattern 21'. For example, the plating lead wire 23' may be disposed so as to be surrounded by the constant-voltage pattern 21'. Alternatively, the constant-voltage pattern 21' may be disposed continuously around the printed substrate 11 at the outer side of the plating lead wire 23'.

Before the gap 24 is formed in the plating lead wire 23', the plating lead wire 23' is connected to the constant-voltage pattern 21'. Moreover, the metal coating layer 14a may be formed on the front surface of the terminal electrode 22 in a state where the plating lead wire 23' is connected to the constant-voltage pattern 21'. Further, the gap 24 may be formed in the plating lead wire 23' after the metal coating layer 14a is formed on the front surface of the terminal electrode 22.

Here, since the plating lead wire 23' is connected to the constant-voltage pattern 21' before the gap 24 is formed in the plating lead wire 23', it is possible to prevent the constant-voltage pattern 21' from being segmented by the plating lead wire 23'. Thus, it is not necessary to form the through-hole 25 and the different-layer wires 26 illustrated in FIG. 1B in order to connect the constant-voltage pattern 21'. Accordingly, since it is not necessary to draw the signal wire around so as to avoid the different-layer wires 26, it is possible to improve the quality of signals.

Seventh Embodiment

Figure 11A:
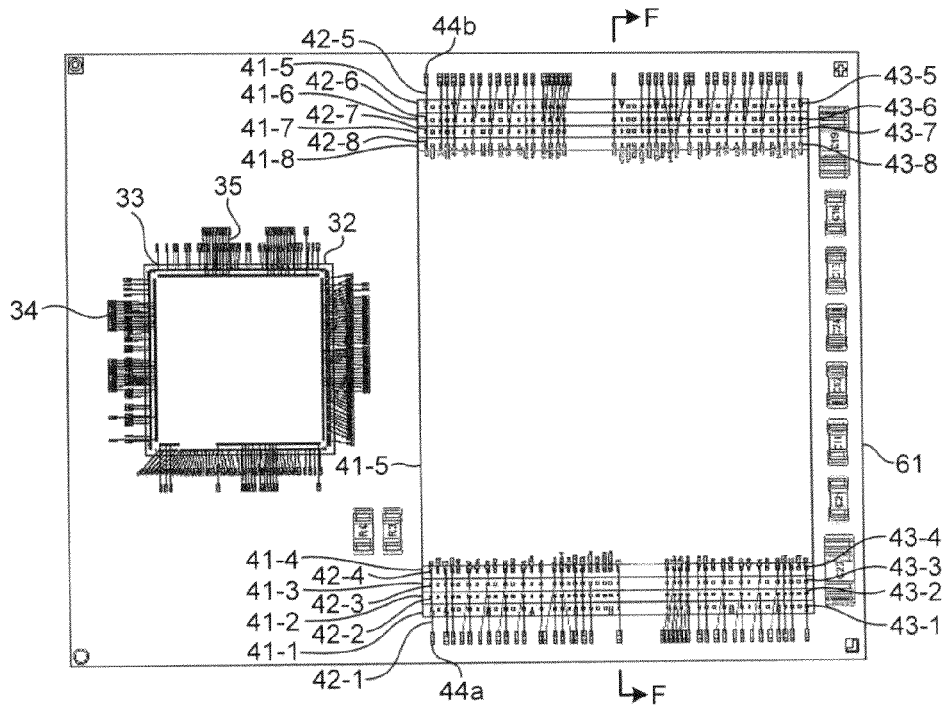
FIGS. 11A and 11B are plan views illustrating a schematic configuration of respective layers of a semiconductor module according to a seventh embodiment.
Figure 11B:
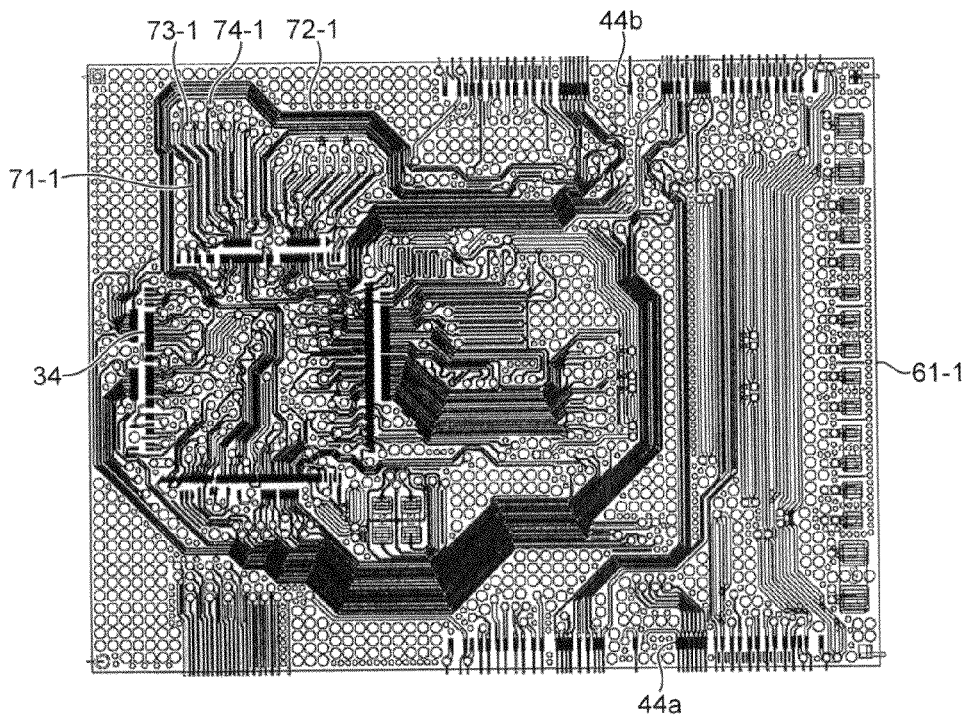
Figure 12A:
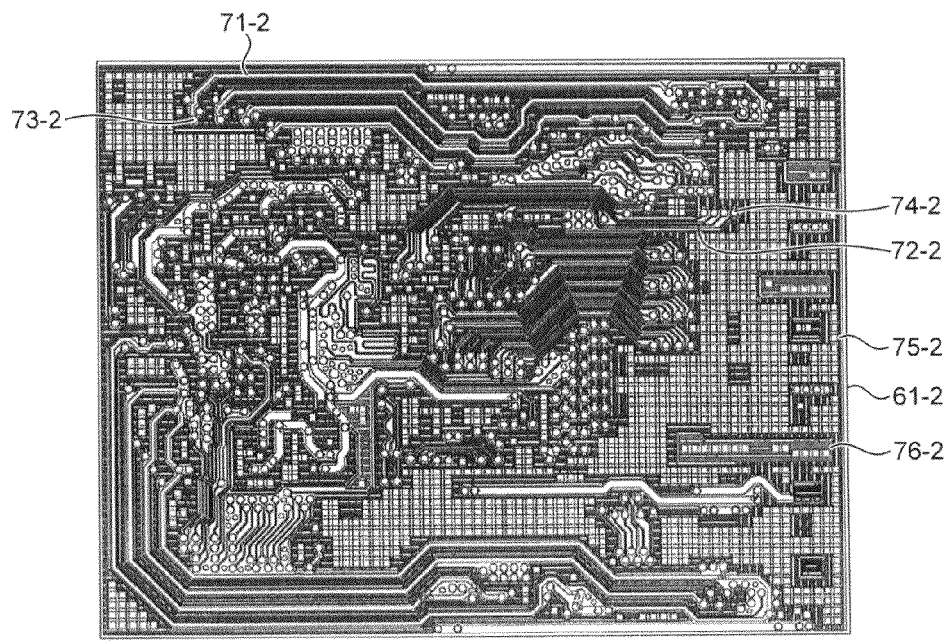
FIGS. 12A and 12B are plan views illustrating a schematic configuration of respective layers of the semiconductor module according to the seventh embodiment.
Figure 12B:
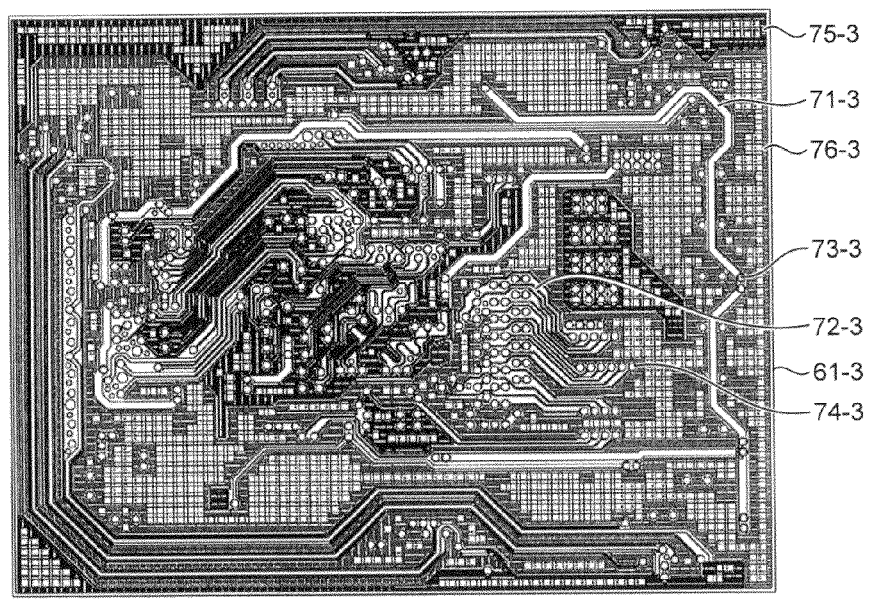
Figure 13A:
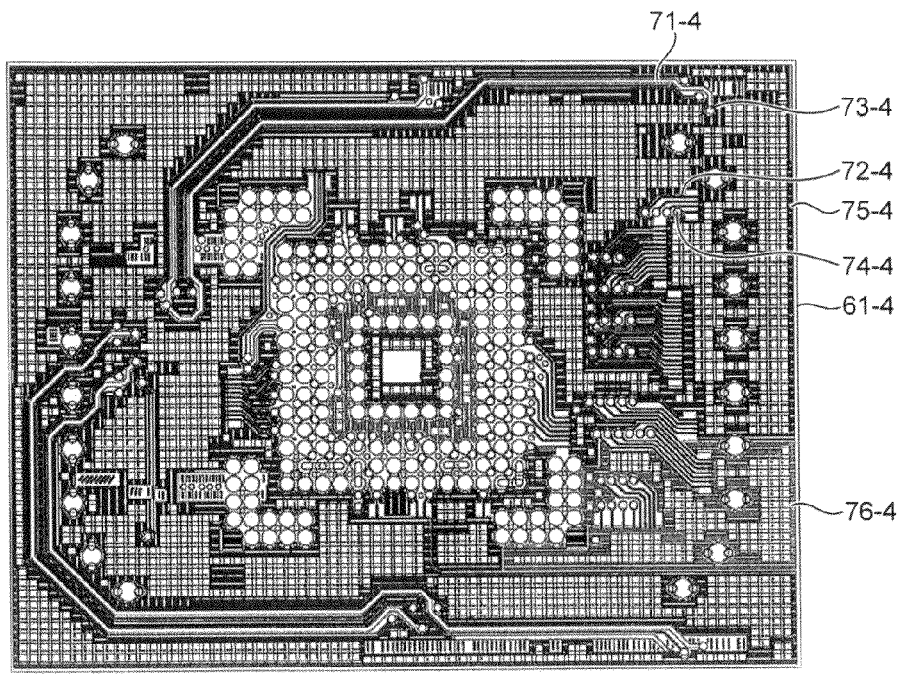
FIGS. 13A and 13B are plan views illustrating a schematic configuration of respective layers of the semiconductor module according to the seventh embodiment.
Figure 13B:
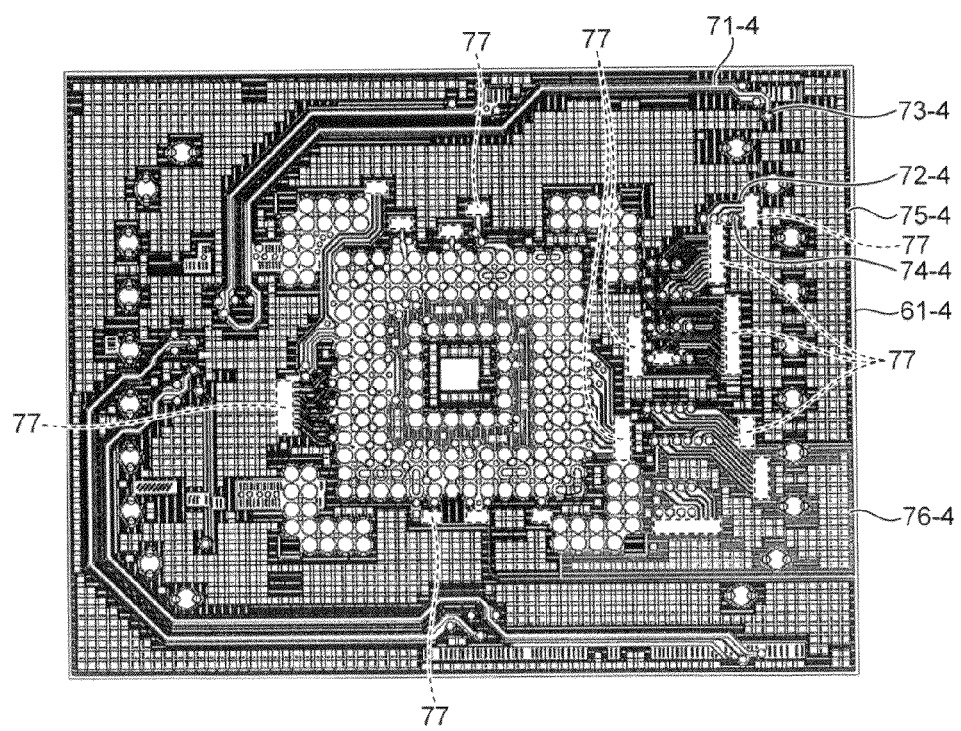
Figure 14A:
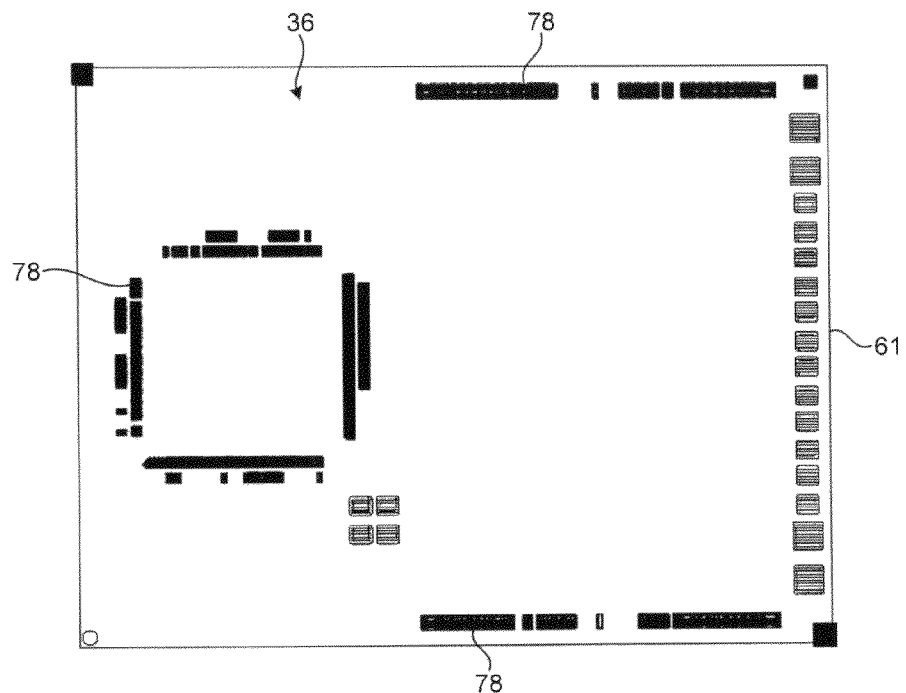
FIGS. 14A and 14B are plan views illustrating a schematic configuration of respective layers of the semiconductor module according to the seventh embodiment.
Figure 14B:
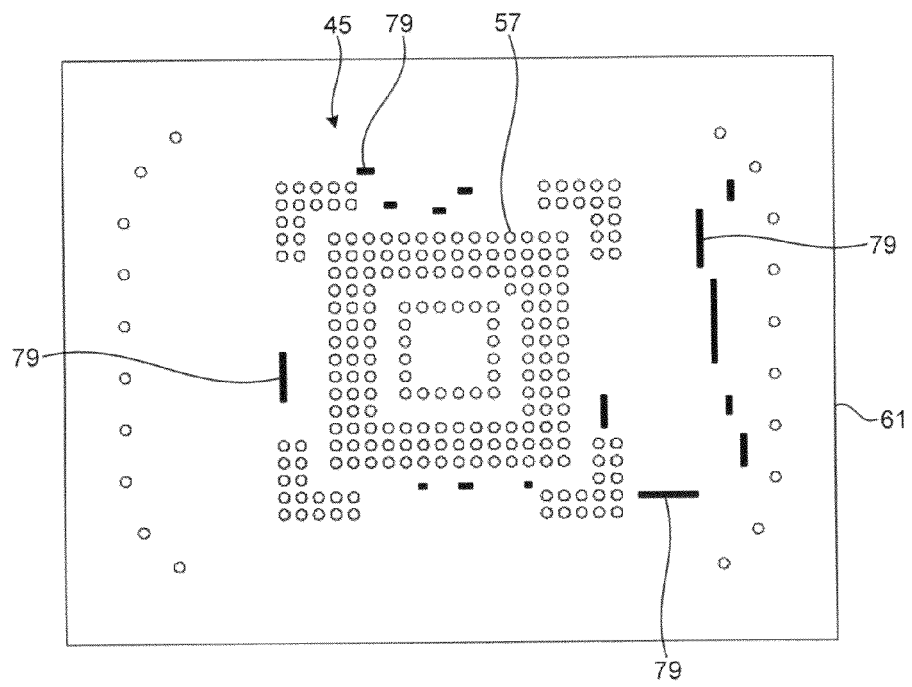

FIGS. 11A to 14A and FIGS. 11B to 14B are plan views illustrating a schematic configuration of respective layers of a semiconductor module according to a seventh embodiment. The seventh embodiment illustrates a case where a four-layered substrate is used. FIG. 11A illustrates a mounting state on a printed substrate 61, and FIG. 11B illustrates the configuration of a first wiring layer of the printed substrate 61. FIG. 12A illustrates the configuration of a second wiring layer of the printed substrate 61, and FIG. 12B illustrates the configuration of a third wiring layer of the printed substrate 61. FIG. 13A illustrates the configuration of a fourth wiring layer of the printed substrate 61 before a gap 77 is formed, and FIG. 13B illustrates the configuration of the fourth wiring layer of the printed substrate 61 after the gap 77 is formed. FIG. 14A illustrates the configuration of a solder resist layer 36 of the first wiring layer of the printed substrate 61, and FIG. 14B illustrates the configuration of a solder resist layer 45 of the fourth wiring layer of the printed substrate 61.

In FIG. 11A, terminal electrodes 34, 44a, and 44b are formed on the front surface of the printed substrate 61. The solder resist layer 36 is formed on the front surface of the printed substrate 61 so that the front surfaces of the terminal electrodes 34, 44a, and 44b are exposed. Here, a metal coating layer 48b is formed on the front surfaces of the terminal electrodes 34, 44a, and 44b exposed from the solder resist layer 36. Moreover, semiconductor chips 32 and 41-1 to 41-8 are mounted on the front-surface side of the printed substrate 61.

Moreover, the pad electrodes 33 are electrically connected to the terminal electrodes 34 via the bonding wires 35. The pad electrodes 43-1 to 43-4 are electrically connected to the terminal electrodes 44a via the bonding wires 42-1 to 42-4, respectively. The pad electrodes 43-5 to 43-8 are electrically connected to the terminal electrodes 44b via the bonding wires 42-5 to 42-8, respectively.

Moreover, in FIG. 11B, the terminal electrodes 34, 44a, 44b, signal wires 71-1, plating lead wires 72-1, and through-holes 73-1 and 74-1 are formed on the first wiring layer 61-1.

Here, the plating lead wires 72-1 are connected to the terminal electrodes 34, 44a, and 44b. Moreover, the through-holes 73-1 enable the signal wires 71-1 of the subject layer to be connected to the signal wires of the other layers. The through-holes 74-1 enable the plating lead wires 72-1 of the subject layer to be connected to the plating lead wires of the other layers.

Moreover, in FIG. 12A, signal wires 71-2, plating lead wires 72-2, through-holes 73-2 and 74-2, a ground pattern 75-2, and a voltage source pattern 76-2 are formed on the second wiring layer 61-2. Here, the through-holes 73-2 enable the signal wires 71-2 of the subject layer to be connected to the signal wires of the other layers. The through-holes 74-2 enable the plating lead wires 72-2 of the subject layer to be connected to the plating lead wires of the other layers.

Moreover, in FIG. 12B, signal wires 71-3, plating lead wires 72-3, through-holes 73-3 and 74-3, a ground pattern 75-3, and a voltage source pattern 76-3 are formed on the third wiring layer 61-3. Here, the through-holes 73-3 enable the signal wires 71-3 of the subject layer to be connected to the signal wires of the other layers. The through-holes 74-3 enable the plating lead wires 72-3 of the subject layer to be connected to the plating lead wires of the other layers.

Moreover, in FIG. 13A, terminal electrodes 46, signal wires 71-4, plating lead wires 72-4, through-holes 73-4 and 74-4, a ground pattern 75-4, and a voltage source pattern 76-4 are formed on the fourth wiring layer 61-4 before the gap 77 of FIG. 13B is formed. The plating lead wires 72-4 may be disposed so as to be surrounded by the ground pattern 75-4 or the voltage source pattern 76-4.

Here, the plating lead wires 72-4 are connected to the terminal electrodes 46 and are also connected to the ground pattern 75-4 or the voltage source pattern 76-4. Moreover, the through-holes 73-4 enable the signal wires 71-4 of the subject layer to be connected to the signal wires of the other layers. The through-holes 74-4 enable the plating lead wires 72-4 of the subject layer to be connected to the plating lead wires of the other layers.

Moreover, as illustrated in FIG. 13B, after the metal coating layer 48a is formed on the terminal electrodes 46, the plating lead wires 72-4 are divided by the ground pattern 75-4 and the voltage source pattern 76-4 by forming the gap 77 in the plating lead wires 72-4. In this case, the gap 77 may be disposed so that the end portions of the plating lead wires 72-4 face the ground pattern 75-4 and the voltage source pattern 76-4.

Moreover, in FIG. 14A, the solder resist layer 36 is formed on the front surface of the printed substrate 61 so as to cover the terminal electrodes 34, 44a, and 44b, the signal wires 71-1, the plating lead wires 72-1, and the through-holes 73-1 and 74-1. Here, openings 78 are formed in the solder resist layer 36 so that the front surfaces of the terminal electrodes 34, 44a, and 44b are exposed.

Moreover, in FIG. 14B, the solder resist layer 45 is formed on the rear surface of the printed substrate 61 so as to cover the terminal electrodes 46, the signal wires 71-4, the plating lead wires 72-4, the through-holes 73-4 and 74-4, the ground pattern 75-4, and the voltage source pattern 76-4. Here, openings 57 and 79 are formed in the solder resist layer 45 so that the front surfaces of the terminal electrodes 46 and the gap 77 are exposed.

Here, since the plating lead wires 72-4 are connected to the ground pattern 75-4 or the voltage source pattern 76-4 before the gap 77 is formed in the plating lead wires 72-4, it is possible to prevent the ground pattern 75-4 and the voltage source pattern 76-4 from being segmented by the plating lead wires 72-4.

Eighth Embodiment

Figure 15A:
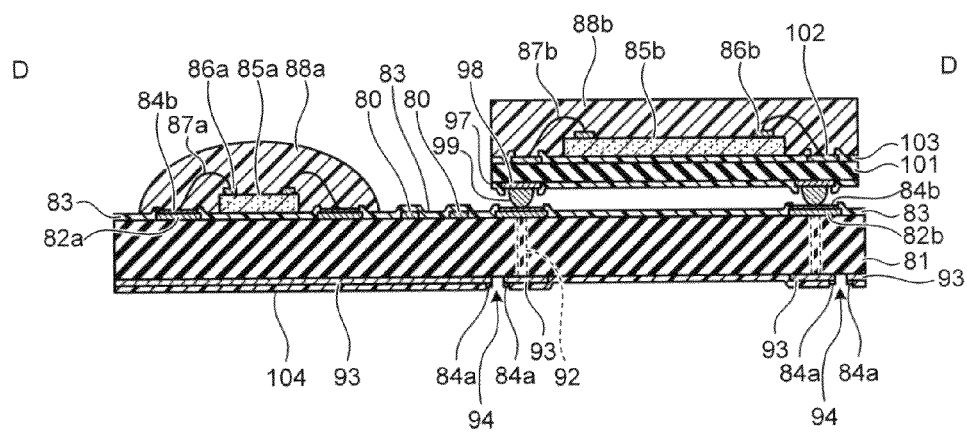
FIG. 15A is a cross-sectional view illustrating a schematic configuration of a semiconductor module according to an eighth embodiment and FIG. 15B is a plan view illustrating a schematic configuration of the semiconductor module according to the eighth embodiment.
Figure 15B:
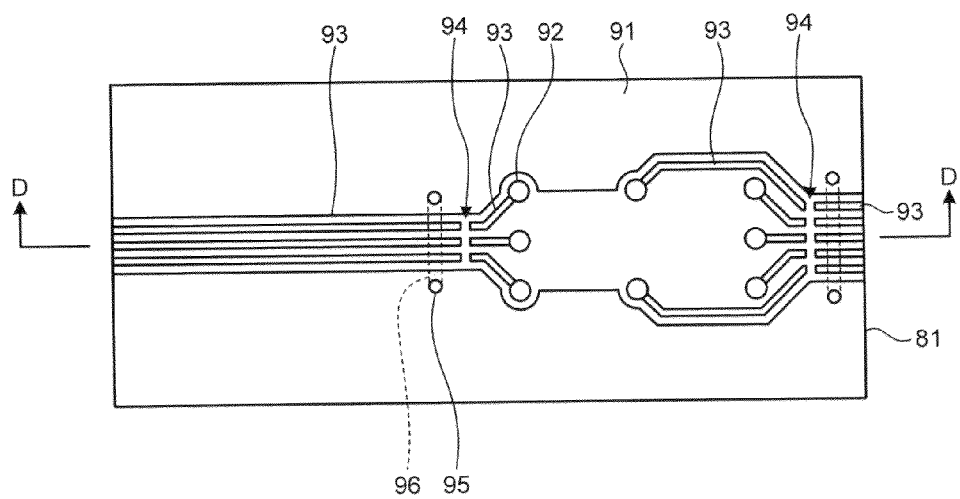

FIG. 15A is a cross-sectional view illustrating a schematic configuration of a semiconductor module according to an eighth embodiment and FIG. 15B is a plan view illustrating a schematic configuration of the semiconductor module according to the eighth embodiment. FIG. 15A is a cross-sectional view taken along line D-D of FIG. 15B.

In FIGS. 15A and 15B, terminal electrodes 82a and 82b and a plating lead wire 80 are formed on the front surface of a printed substrate 81. Moreover, a solder resist layer 83 is formed on the front surface of the printed substrate 81 so that the front surfaces of the terminal electrodes 82a and 82b are exposed. Here, a metal coating layer 84b is formed on the front surfaces of the terminal electrodes 82a and 82b exposed from the solder resist layer 83.

Moreover, a semiconductor chip 85a and a printed substrate 101 are mounted on the front-surface side of the printed substrate 81, and a semiconductor chip 85b is mounted on the front-surface side of the printed substrate 101. The semiconductor chip 85a may be mounted on the front-surface side of the printed substrate 81 using a bare-chip bonding technique. The semiconductor chip 85b may be mounted on the front-surface side of the printed substrate 81 using a ball-grid array (BGA) technique. A NAND memory, for example, may be formed on the semiconductor chip 85b. A controller for controlling the driving of the NAND memory, for example, may be formed on the semiconductor chip 85a.

Here, a pad electrode 86a is formed on the semiconductor chip 85a. The pad electrode 86a is electrically connected to the terminal electrode 82a via a bonding wire 87a. Moreover, a sealing resin 88a is formed on the front-surface side of the printed substrate 81, and the semiconductor chip 85a and the bonding wire 87a are sealed by the sealing resin 88a.

Moreover, a terminal electrode 102 is formed on the front surface of the printed substrate 101. A solder resist layer 103 is formed on the front surface of the printed substrate 101 so that the front surface of the terminal electrode 102 is exposed. Moreover, a pad electrode 86b is formed on the semiconductor chip 85b. The pad electrode 86b is electrically connected to the terminal electrode 102 via the bonding wire 87b. Moreover, a sealing resin 88b is formed on the front-surface side of the printed substrate 101, and the semiconductor chip 85b and the bonding wire 87b are sealed by the sealing resin 88b. Moreover, a terminal electrode 98 is formed on the rear surface of the printed substrate 101. A solder resist layer 97 is formed on the rear surface of the printed substrate 101 so that the front surface of the terminal electrode 98 is exposed. A solder ball 99 is formed on the terminal electrode 98, and the solder ball 99 is bonded to the terminal electrode 82b via the metal coating layer 84b.

On the other hand, a plating lead wire 93 is formed on the rear surface of the printed substrate 81, and a gap 94 is formed in the plating lead wire 93, whereby the plating lead wire 93 is divided halfway. Here, before the gap 94 is formed in the plating lead wire 93, the plating lead wire 93 is electrically connected to the terminal electrodes 82a and 82b via the through-holes 92 and the plating lead wire 80. In order to decrease the amount of the plating lead wire 93 superimposed on the terminal electrode 82b as a stub wire, it is preferable to dispose the gap 94 of the plating lead wire 93 in the vicinity of the through-hole 92. Moreover, a constant-voltage pattern 91 is formed on the rear surface of the printed substrate 81 outside the through-hole 92 and the plating lead wire 93. The constant-voltage pattern 91 may be a ground pattern and may be a voltage source pattern. The solder resist layer 104 is formed on the rear surface of the printed substrate 81 so that the front surface of the gap 94 of the plating lead wire 93 is exposed. A range of areas of the plating lead wire 93 exposed from the solder resist layer 104 may be set to be larger than that of the gap 94. A metal coating layer 84a is formed on part of the front surface of the plating lead wire 93 exposed from the solder resist layer 104.

Moreover, the constant-voltage pattern 91 is segmented by the plating lead wire 93. The constant-voltage patterns 91 segmented by the plating lead wire 93 are electrically connected to each other by different-layer wires 96 connected to a through-hole 95.

Here, since the gap 94 is formed in the plating lead wire 93 with the plating lead wire 93 remaining on the printed substrate 81, it is possible to decrease the stub wire superimposed on the terminal electrode 82b without increasing the range of areas of the plating lead wire 93 exposed from the solder resist layer 104 more than necessary. Thus, it is possible to reduce stub noise superimposed on signals while suppressing a decrease in reliability of the printed substrate 81 and to suppress a decrease in the quality of signals.

Ninth Embodiment

Figure 16A:
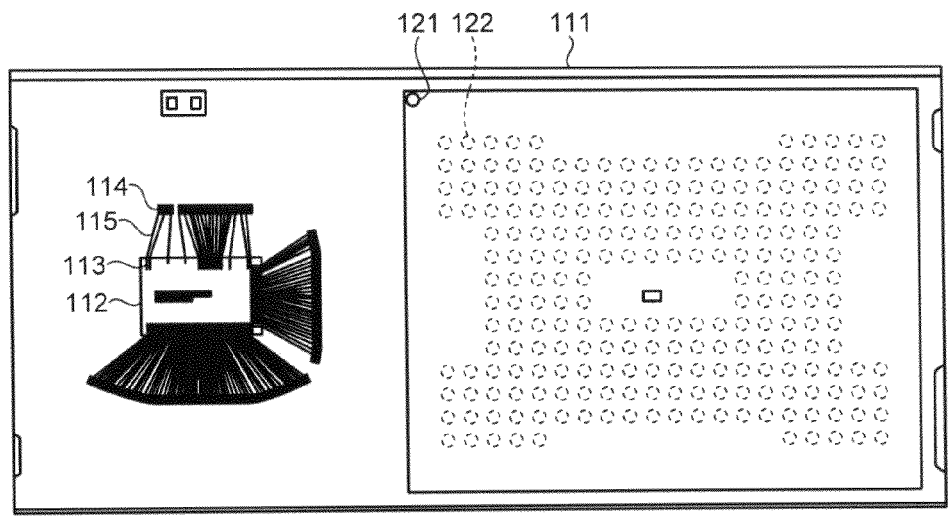
FIGS. 16A and 16B are plan views illustrating a schematic configuration of respective layers of a semiconductor module according to a ninth embodiment.
Figure 16B:
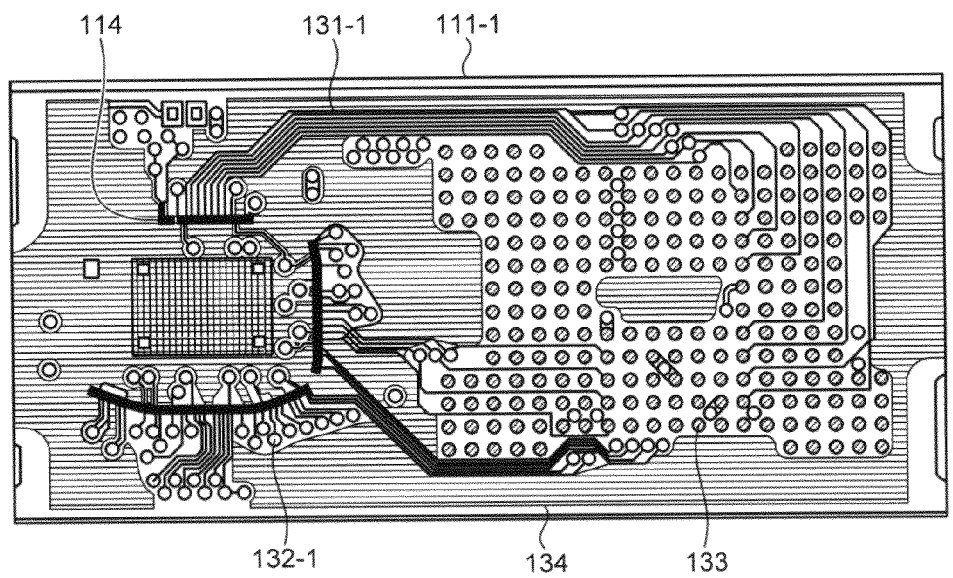
Figure 17A:
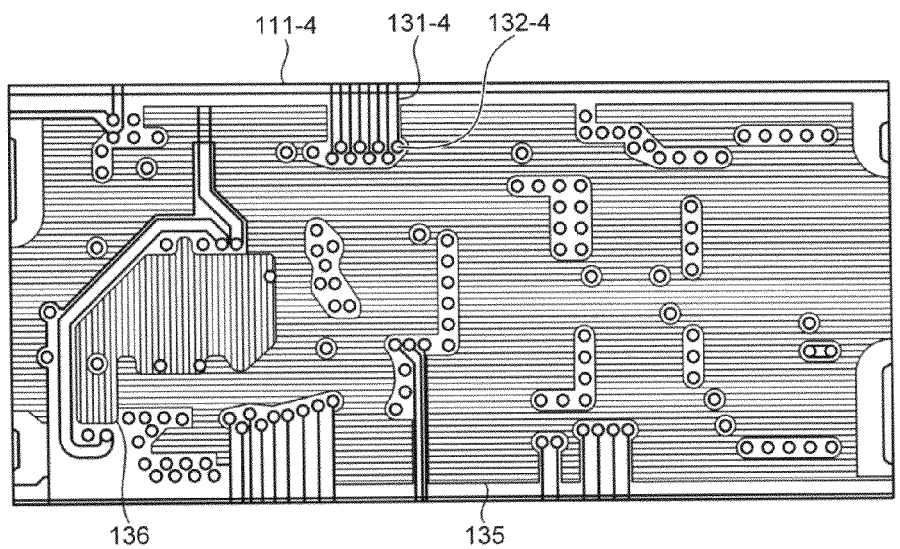
FIGS. 17A and 17B are plan views illustrating a schematic configuration of respective layers of the semiconductor module according to the ninth embodiment.
Figure 17B:
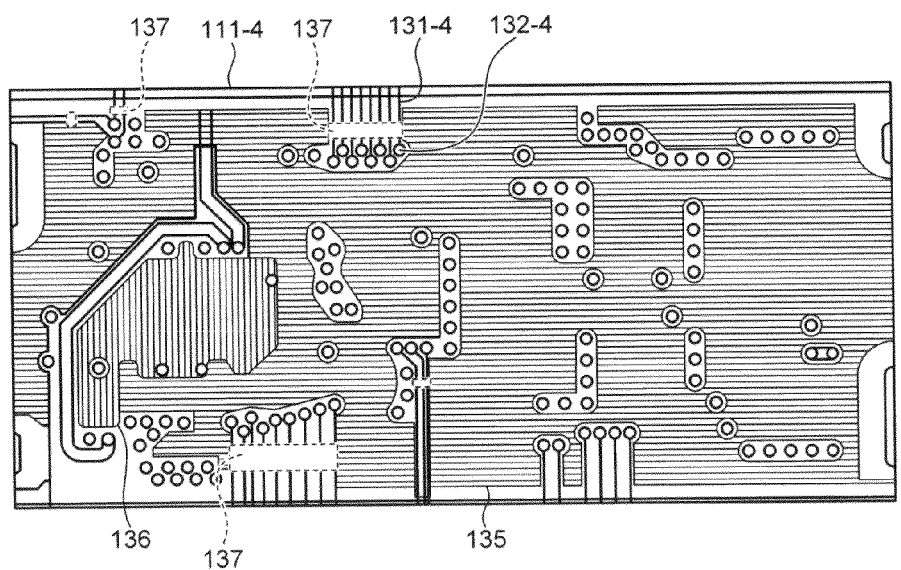

FIGS. 16A and 16B and FIGS. 17A and 17B are plan views illustrating a schematic configuration of respective layers of a semiconductor module according to a ninth embodiment. The ninth embodiment illustrates a case where a four-layered substrate is used. FIG. 16A illustrates a mounting state on a printed substrate 111, and FIG. 16B illustrates the configuration of a first wiring layer of the printed substrate 111. FIG. 17A illustrates the configuration of a fourth wiring layer of the printed substrate 111 before a gap 137 is formed, and FIG. 17B illustrates the configuration of the fourth wiring layer of the printed substrate 111 after the gap 137 is formed. The second and third wiring layers of the printed substrate 111 are not illustrated.

In FIG. 16A, terminal electrodes 114 are formed on the front surface of the printed substrate 111. Here, the front surfaces of the terminal electrodes 114 may be subjected to plating. Moreover, pad electrodes 113 are formed on a semiconductor chip 112. The semiconductor chip 112 is mounted on the front surface of the printed substrate 111, and the pad electrodes 113 are electrically connected to the terminal electrodes 114 via bonding wires 115. Moreover, a BGA 121 is mounted on the front surface of the printed substrate 111 via solder balls 122. A semiconductor chip on which a NAND memory, for example, is formed may be mounted on the BGA 121. A controller for controlling the driving of the NAND memory, for example, may be formed on the semiconductor chip 112.

Moreover, in FIG. 16B, terminal electrodes 114 and 133, plating lead wires 131-1, through-holes 132-1, and a ground pattern 134 are formed on a first wiring layer 111-1. The solder balls 122 illustrated in FIG. 16A may be bonded to the terminal electrodes 133.

Here, the plating lead wires 131-1 are connected to the terminal electrodes 114 and the through-holes 132-1. Moreover, the through-holes 132-1 enable the plating lead wires 131-1 of the subject layer to be connected to the plating lead wires of the other layers.

Moreover, in FIG. 17A, plating lead wires 131-4, through-holes 132-4, and voltage source patterns 135 and 136 are formed on a fourth wiring layer 111-4 before the gap 137 of FIG. 17B is formed.

Here, the through-holes 132-4 enable the plating lead wires 131-4 of the subject layer to be connected to the plating lead wires of the other layers.

Moreover, as illustrated in FIG. 17B, after the terminal electrodes 114 and 133 are subjected to plating, the plating lead wires 131-4 are divided halfway by forming the gap 137 in the plating lead wires 131-4.

Tenth Embodiment

Figure 18A:
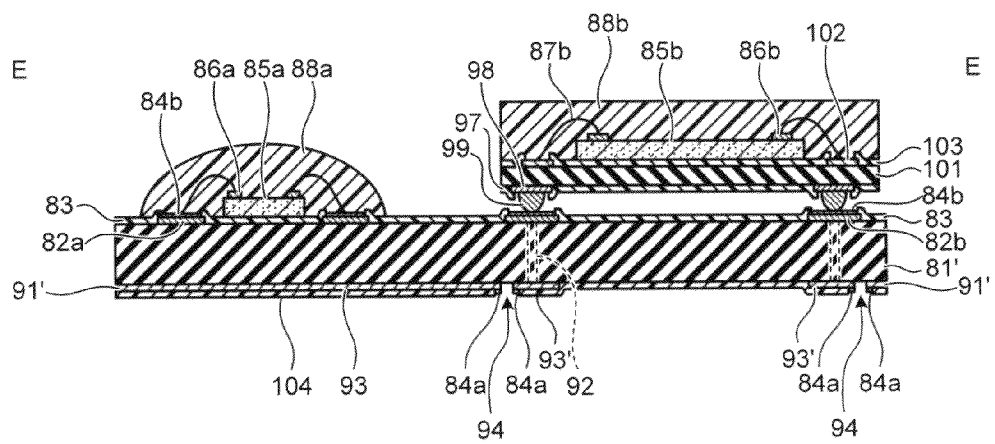
FIG. 18A is a cross-sectional view illustrating a schematic configuration of a semiconductor module according to a tenth embodiment and FIG. 18B is a plan view illustrating a schematic configuration of the semiconductor module according to the tenth embodiment.
Figure 18B:
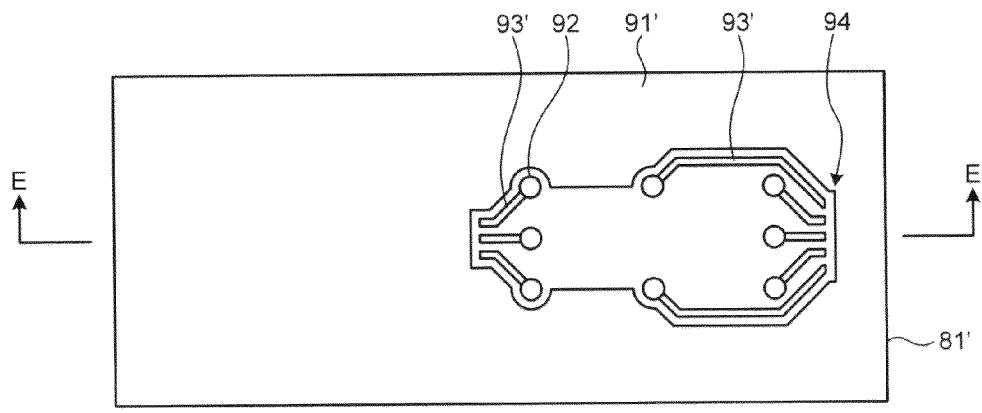

FIG. 18A is a cross-sectional view illustrating a schematic configuration of a semiconductor module according to a tenth embodiment and FIG. 18B is a plan view illustrating a schematic configuration of the semiconductor module according to the tenth embodiment. FIG. 18A is a cross-sectional view taken along line E-E of FIG. 18B.

In the semiconductor module illustrated in FIGS. 18A and 18B, a printed substrate 81' is formed instead of the printed substrate 81 of the semiconductor module illustrated in FIGS. 15A and 15B. A constant-voltage pattern 91' and a plating lead wire 93' are formed on the printed substrate 81' instead of the constant-voltage pattern 91 and the plating lead wire 93 of the printed substrate 81. The constant-voltage pattern 91' may be a ground pattern and may be a voltage source pattern.

Here, a gap 94 is formed in the plating lead wire 93'. Moreover, the plating lead wire 93' is disposed so that the end portion thereof faces the constant-voltage pattern 91'. For example, the plating lead wire 93' may be disposed so as to be surrounded by the constant-voltage pattern 91'.

Before the gap 94 is formed in the plating lead wire 93', the plating lead wire 93' is connected to the constant-voltage pattern 91'. Moreover, the metal coating layer 84b may be formed on the front surfaces of the terminal electrodes 82a and 82b in a state where the plating lead wire 93' is connected to the constant-voltage pattern 91'. Further, the gap 94 may be formed in the plating lead wire 93' after the metal coating layer 84b is formed on the front surfaces of the terminal electrodes 82a and 82b.

Here, since the plating lead wire 93' is connected to the constant-voltage pattern 91' before the gap 94 is formed in the plating lead wire 93', it is possible to prevent the constant-voltage pattern 91' from being segmented by the plating lead wire 93'.

Eleventh Embodiment

Figure 19:
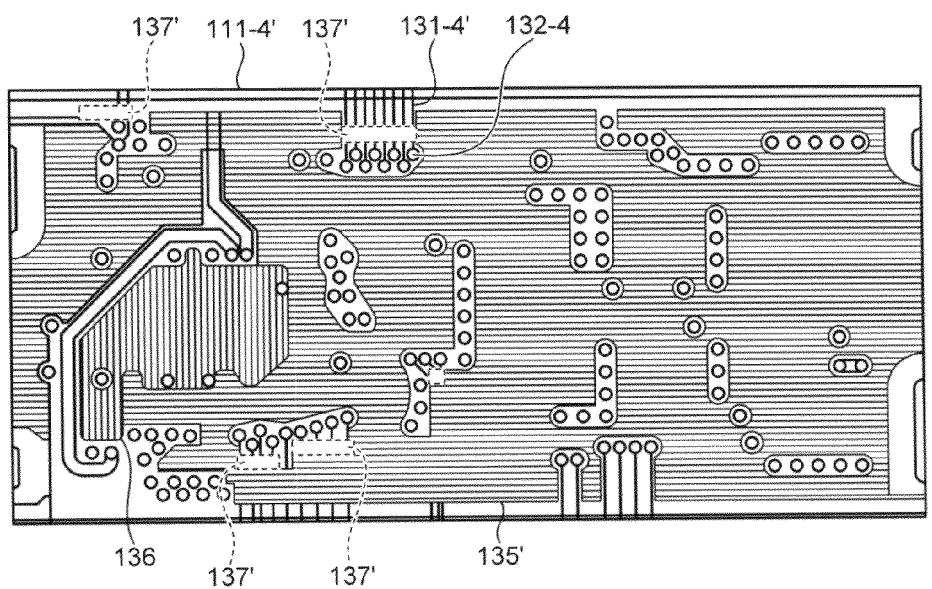
FIG. 19 is a plan view illustrating a schematic configuration of respective layers of a semiconductor module according to an eleventh embodiment.

FIG. 19 is a plan view illustrating a schematic configuration of respective layers of a semiconductor module according to an eleventh embodiment.

In the semiconductor module illustrated in FIG. 19, a fourth wiring layer 111-4' is formed instead of the fourth wiring layer 111-4 of FIG. 17B. On the fourth wiring layer 111-4', a voltage source pattern 135', plating lead wires 131-4', and a gap 137' are formed instead of the voltage source pattern 135, the plating lead wires 131-4, and the gap 137 of the fourth wiring layer 111-4. Here, the plating lead wires 131-4' are disposed so that the end portions thereof face the voltage source pattern 135'.

The plating lead wires 131-4' are connected to the voltage source pattern 135' before the gap 137' is formed in the plating lead wires 131-4'. The front surfaces of the terminal electrodes 133 of FIG. 16A may be subjected to plating in a state where the plating lead wires 131-4' are connected to the voltage source pattern 135'. The gap 137' may be formed in the plating lead wires 131-4' after the front surfaces of the terminal electrodes 133 are subjected to plating.

Here, since the plating lead wires 131-4' are connected to the voltage source pattern 135' before the gap 137' is formed in the plating lead wires 131-4', it is possible to prevent the voltage source pattern 135' from being segmented by the plating lead wires 131-4'.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor module comprising:
   a substrate;
   a semiconductor chip on the substrate;
   a plurality of terminal electrodes on the substrate, each terminal electrode being electrically connected to the semiconductor chip;
   a metal coating layer on each of the terminal electrodes;
   a plurality of wiring lines, each wiring line including:
      a first wiring portion extending along a first direction, the first wiring portion being connected to a respective one of the terminal electrodes, and
      a second wiring portion extending along the first direction at a position separated from the first wiring portion, an end of the second wiring portion facing an end of the first wiring portion along the first direction, the second wiring portion being electrically floating; and
   a pattern disposed around the terminal electrodes and the wiring lines, wherein
   the pattern is separated from any portion between the ends of the first wiring portions and the ends of the second wiring portions, and
   wherein the plurality of the wiring lines are spaced apart in a second direction, the second direction being a direction that intersects the first direction.

2. A semiconductor module comprising:
   a substrate;
   a semiconductor chip on the substrate;
   a plurality of terminal electrodes on the substrate, each terminal electrode being electrically connected to the semiconductor chip;
   a metal coating layer on each of the terminal electrodes;
   a plurality of wiring lines, each wiring line including:
      a first wiring portion extending along a first direction, the first wiring portion being connected to a respective one of the terminal electrodes, and
      a second wiring portion extending along the first direction at a position separated from the first wiring portion, an end of the second wiring portion facing an end of the first wiring portion along the first direction, the second wiring portion being electrically floating;
   wherein
   the metal coating layer is a plated layer, each of the wiring lines being a plated wiring line, and
   wherein the plurality of the wiring lines are spaced apart in a second direction, the second direction being a direction that intersects the first direction.

3. The semiconductor module according to claim 1, wherein
   the pattern is a voltage source pattern or a ground pattern.

4. The semiconductor module according to claim 1, further comprising
   a solder ball on each terminal electrode.

5. The semiconductor module according to claim 1, further comprising:
   a solder resist layer on the substrate so as to cover the wiring lines; and
   an opening that is formed in the solder resist layer so that the position separated from the first wiring portion is exposed.

6. The semiconductor module according to claim 1, wherein
   the semiconductor chip comprises:
   a first semiconductor chip on which a NAND memory is formed; and
   a second semiconductor chip on which a controller for controlling driving of the NAND memory is formed, and
   the first and second semiconductor chips are mounted on a front-surface side of the substrate.

7. The semiconductor module according to claim 6, wherein
   the first and second semiconductor chips are mounted on the front-surface side of the substrate using a bare-chip mounting technique.

8. The semiconductor module according to claim 7, wherein
   a plurality of the first semiconductor chips are stacked on the front-surface side of the substrate.

9. The semiconductor module according to claim 8, wherein
   the terminal electrodes and the wiring lines are formed on a rear-surface side of the substrate.

10. The semiconductor module according to claim 7, wherein
    the first and second semiconductor chips are electrically connected to the substrate via bonding wires.

11. The semiconductor module according to claim 10, further comprising
    a sealing resin that seals the first and second semiconductor chips and the bonding wires on the front-surface side of the substrate.

12. The semiconductor module according to claim 6, wherein
    the first semiconductor chip is mounted on the front-surface side of the substrate using a BGA, and the second semiconductor chip is mounted on the front-surface side of the substrate using a bare-chip mounting technique.

13. The semiconductor module according to claim 12, wherein
    a plurality of the first semiconductor chips are stacked on the BGA.

14. The semiconductor module according to claim 13, wherein
    each terminal electrode is formed on the front-surface side of the substrate,
    each wiring line is formed on a rear-surface side of the substrate, and
    each terminal electrode and each wiring line are electrically connected via a through-hole formed on the substrate.

15. The semiconductor module according to claim 14, wherein
    the second semiconductor chip is electrically connected to the substrate via a bonding wire.

16. The semiconductor module according to claim 15, further comprising
    a sealing resin that seals the second semiconductor chip and the bonding wire on the front-surface side of the substrate.

17. A semiconductor module comprising:
    a substrate;
    a semiconductor chip on the substrate;
    a plurality of terminal electrodes on the substrate, each terminal electrode being electrically connected to the semiconductor chip;
    a metal coating layer on each of the terminal electrodes;
    a plurality of wiring lines, each wiring line including:
        a first wiring portion extending along a first direction, the first wiring portion being connected to a respective one of the terminal electrodes, and
        a second wiring portion extending along the first direction at a position separated from the first wiring portion, an end of the second wiring portion facing an end of the first wiring portion along the first direction, the second wiring portion being electrically floating; wherein
    the terminal electrodes, the first wiring portions, and the second wiring portions longitudinally extend along a same plane parallel to a top or bottom surface of the substrate, and
    wherein the plurality of the wiring lines are spaced apart in a second direction, the second direction being a direction that intersects the first direction.

18. The semiconductor module according to claim 1, wherein the second wiring portion extends to an end of the substrate.

19. The semiconductor module according to claim 2, wherein the second wiring portion extends to an end of the substrate.

20. The semiconductor module according to claim 17, wherein the second wiring portion extends to an end of the substrate.

* * * * *